(12) United States Patent
So et al.

(10) Patent No.: US 10,134,815 B2
(45) Date of Patent: Nov. 20, 2018

(54) METHOD AND APPARATUS FOR DETECTING INFRARED RADIATION WITH GAIN

(75) Inventors: Franky So, Gainesville, FL (US); Do Young Kim, Gainesville, FL (US); Jae Woong Lee, Gainesville, FL (US); Bhabendra K. Pradhan, Marietta, GA (US)

(73) Assignees: Nanoholdings, LLC, Rowayton, CT (US); University of Florida Research Foundation, Incorporated, Gainesville, FL (US)

( * ) Notice: Subject to any disclaimer, the term of this patent is extended or adjusted under 35 U.S.C. 154(b) by 861 days.

(21) Appl. No.: 14/129,225

(22) PCT Filed: Jul. 2, 2012

(86) PCT No.: PCT/US2012/045272
§ 371 (c)(1),
(2), (4) Date: Mar. 27, 2014

(87) PCT Pub. No.: WO2013/003850
PCT Pub. Date: Jan. 3, 2013

(65) Prior Publication Data
US 2014/0217284 A1    Aug. 7, 2014

Related U.S. Application Data
(60) Provisional application No. 61/503,317, filed on Jun. 30, 2011.

(51) Int. Cl.
G02F 1/01        (2006.01)
H01L 27/32      (2006.01)
(Continued)

(52) U.S. Cl.
CPC ........ H01L 27/3227 (2013.01); H01L 27/288 (2013.01); H01L 31/022466 (2013.01);
(Continued)

(58) Field of Classification Search
CPC ............. H01L 2251/308; H01L 31/101; H01L 51/5088
See application file for complete search history.

(56) References Cited

U.S. PATENT DOCUMENTS 4,614,958 A    9/1986  Mikami et al.
4,679,063 A    7/1987  White
(Continued)

FOREIGN PATENT DOCUMENTS

CN    1532959 A    9/2004
CN    1637628 A    7/2005
(Continued)

OTHER PUBLICATIONS

"Organic Photovoltaic cells and Organic Up-conversion Devices", pp. 1-173 (2009) to Kim (hereinafter "Kim"), available at: http://ufdc.ufl.edu/UFE0024091/00001.*
(Continued)

Primary Examiner — Kenneth J Malkowski
(74) Attorney, Agent, or Firm — Wolf, Greenfield & Sacks, P.C.

(57) ABSTRACT

Photodetectors, methods of fabricating the same, and methods using the same to detect radiation are described. A photodetector can include a first electrode, a light sensitizing layer, an electron blocking/tunneling layer, and a second electrode. Infrared-to-visible upconversion devices, methods of fabricating the same, and methods using the same to detect radiation are also described. An Infrared-to-visible upconversion device can include a photodetector and an OLED coupled to the photodetector.

64 Claims, 11 Drawing Sheets

(51) Int. Cl.
| | |
|---|---|
| *H01L 51/42* | (2006.01) |
| *H01L 31/0352* | (2006.01) |
| *H01L 31/09* | (2006.01) |
| *H01L 31/14* | (2006.01) |
| *H01L 31/0224* | (2006.01) |
| *H01L 31/18* | (2006.01) |
| *H01L 51/00* | (2006.01) |
| *H01L 51/44* | (2006.01) |
| *H01L 51/56* | (2006.01) |
| *H04N 5/33* | (2006.01) |
| *H01L 27/28* | (2006.01) |
| *H01L 51/50* | (2006.01) |
| *H01L 31/0256* | (2006.01) |

(52) U.S. Cl.
CPC ........ *H01L 31/022475* (2013.01); *H01L 31/022491* (2013.01); *H01L 31/035218* (2013.01); *H01L 31/09* (2013.01); *H01L 31/143* (2013.01); *H01L 31/1804* (2013.01); *H01L 31/184* (2013.01); *H01L 31/1808* (2013.01); *H01L 51/0047* (2013.01); *H01L 51/0078* (2013.01); *H01L 51/0084* (2013.01); *H01L 51/4213* (2013.01); *H01L 51/442* (2013.01); *H01L 51/56* (2013.01); *H04N 5/33* (2013.01); *H01L 51/0059* (2013.01); *H01L 51/422* (2013.01); *H01L 51/5048* (2013.01); *H01L 2031/0344* (2013.01); *Y02E 10/549* (2013.01)

(56) References Cited

U.S. PATENT DOCUMENTS

| | | | |
|---|---|---|---|
| 4,755,674 A | 7/1988 | Schaaf |
| 4,778,692 A | 10/1988 | Ishihara et al. |
| 4,885,211 A | 12/1989 | Tang et al. |
| 5,121,398 A | 6/1992 | Rao |
| 5,122,905 A | 6/1992 | Wheatley et al. |
| 5,270,092 A | 12/1993 | Griffith et al. |
| 5,315,129 A | 5/1994 | Forrest et al. |
| 5,336,578 A | 8/1994 | Nukada et al. |
| 5,389,788 A | 2/1995 | Grinberg et al. |
| 5,438,198 A | 8/1995 | Ebitani et al. |
| 5,619,039 A | 4/1997 | Montanari |
| 5,710,428 A | 1/1998 | Ko |
| 5,811,834 A | 9/1998 | Tamano et al. |
| 5,965,875 A | 10/1999 | Merrill |
| 6,140,646 A | 10/2000 | Busta et al. |
| 6,337,492 B1 | 1/2002 | Jones et al. |
| 6,509,574 B2 | 1/2003 | Yuan et al. |
| 6,579,629 B1 | 6/2003 | Raychaudhuri et al. |
| 6,734,452 B2 | 5/2004 | Gunapala et al. |
| 6,777,961 B2 | 8/2004 | Hamamoto et al. |
| 6,906,326 B2 | 6/2005 | Koch et al. |
| 6,914,315 B2 | 7/2005 | Lai et al. |
| 6,972,431 B2 | 12/2005 | Forrest et al. |
| 7,247,850 B2 | 7/2007 | Laou et al. |
| 7,270,586 B2 | 9/2007 | Tokailin et al. |
| 7,279,705 B2 | 10/2007 | Iou |
| 7,300,731 B2 | 11/2007 | Wang |
| 7,381,953 B1 | 6/2008 | Kaufman |
| 8,304,728 B2 | 11/2012 | So |
| 8,405,028 B2 | 3/2013 | So |
| 8,441,187 B2 | 5/2013 | Hunze et al. |
| 8,507,865 B2 | 8/2013 | Boberl et al. |
| 8,592,801 B2 | 11/2013 | So et al. |
| 8,716,701 B2 | 5/2014 | So et al. |
| 8,796,699 B2 | 8/2014 | So et al. |
| 8,829,498 B2 | 9/2014 | So et al. |
| 9,006,752 B2 | 4/2015 | So et al. |
| 9,054,262 B2 | 6/2015 | Lewis et al. |
| 9,196,661 B2 | 11/2015 | So et al. |
| 9,214,502 B2 | 12/2015 | So et al. |
| 9,276,048 B2 | 3/2016 | So |
| 2002/0027206 A1 | 3/2002 | Yuan et al. |
| 2002/0066904 A1 | 6/2002 | Yuan et al. |
| 2002/0130248 A1 | 9/2002 | Bretschneider et al. |
| 2003/0122749 A1 | 7/2003 | Booth et al. |
| 2003/0168599 A1 | 9/2003 | Liddiard |
| 2003/0218166 A1 | 11/2003 | Tsutsui |
| 2004/0016923 A1 | 1/2004 | Yu et al. |
| 2004/0027059 A1 | 2/2004 | Tsutsui |
| 2004/0031965 A1 | 2/2004 | Forrest et al. |
| 2004/0135222 A1 | 7/2004 | Robert et al. |
| 2004/0222306 A1 | 11/2004 | Fajarillo |
| 2004/0253759 A1 | 12/2004 | Garber et al. |
| 2004/0262614 A1 | 12/2004 | Hack et al. |
| 2005/0077539 A1 | 4/2005 | Lipson |
| 2005/0088079 A1 | 4/2005 | Daniels |
| 2005/0088365 A1 | 4/2005 | Yamazaki et al. |
| 2005/0104089 A1 | 5/2005 | Engelmann et al. |
| 2005/0110007 A1 | 5/2005 | Forrest et al. |
| 2005/0126628 A1 | 6/2005 | Scher et al. |
| 2005/0137301 A1 | 6/2005 | Wu et al. |
| 2005/0155641 A1 | 7/2005 | Fafard |
| 2005/0156609 A1 | 7/2005 | Pfaff et al. |
| 2005/0161703 A1 | 7/2005 | Costello |
| 2005/0168137 A1 | 8/2005 | Adamovich et al. |
| 2005/0228277 A1 | 10/2005 | Barnes et al. |
| 2005/0236556 A1 | 10/2005 | Sargent et al. |
| 2006/0011927 A1 | 1/2006 | Ko |
| 2006/0024526 A1 | 2/2006 | Thompson et al. |
| 2006/0032528 A1 | 2/2006 | Wang |
| 2006/0043361 A1 | 3/2006 | Lee et al. |
| 2006/0081840 A1 | 4/2006 | Mori et al. |
| 2006/0084347 A1 | 4/2006 | Tutt et al. |
| 2006/0097247 A1 | 5/2006 | Kim et al. |
| 2006/0157806 A1 | 7/2006 | Rhodes |
| 2006/0180197 A1 | 8/2006 | Gui et al. |
| 2006/0186803 A1 | 8/2006 | Lim et al. |
| 2006/0192125 A1 | 8/2006 | Yoganandan et al. |
| 2006/0222979 A1 | 10/2006 | Ishida et al. |
| 2006/0227531 A1 | 10/2006 | Iou |
| 2006/0266998 A1 | 11/2006 | Vega et al. |
| 2006/0290270 A1 | 12/2006 | Kim et al. |
| 2007/0029482 A1 | 2/2007 | Laou et al. |
| 2007/0048548 A1 | 3/2007 | Kim et al. |
| 2007/0051876 A1 | 3/2007 | Sumi et al. |
| 2007/0062576 A1 | 3/2007 | Duerr et al. |
| 2007/0096085 A1 | 5/2007 | Rand et al. |
| 2007/0102694 A1 | 5/2007 | Drndic et al. |
| 2007/0116983 A1 | 5/2007 | Kanno et al. |
| 2007/0129545 A1 | 6/2007 | Inoue et al. |
| 2007/0176541 A1 | 8/2007 | Son et al. |
| 2007/0215868 A1 | 9/2007 | Forrest et al. |
| 2007/0216985 A1 | 9/2007 | Woodall et al. |
| 2007/0221888 A1 | 9/2007 | Sakata |
| 2007/0235753 A1 | 10/2007 | Debucquoy et al. |
| 2008/0041447 A1 | 2/2008 | Tseng et al. |
| 2008/0066802 A1 | 3/2008 | Reddy |
| 2008/0110499 A1 | 5/2008 | Chen et al. |
| 2008/0138797 A1 | 6/2008 | Hunt et al. |
| 2008/0142075 A1 | 6/2008 | Reddy et al. |
| 2008/0223445 A1 | 9/2008 | Marks et al. |
| 2008/0272713 A1 | 11/2008 | Kang et al. |
| 2009/0045728 A1 | 2/2009 | Murano et al. |
| 2009/0115310 A1 | 5/2009 | Yamamoto |
| 2009/0140238 A1 | 6/2009 | Brabec et al. |
| 2009/0152664 A1 | 6/2009 | Klem et al. |
| 2009/0206237 A1 | 8/2009 | Shannon et al. |
| 2009/0206745 A1 | 8/2009 | Hwang et al. |
| 2009/0208776 A1 | 8/2009 | Liu et al. |
| 2009/0214967 A1 | 8/2009 | Iwanaga et al. |
| 2009/0217967 A1 | 9/2009 | Hovel et al. |
| 2009/0223566 A1 | 9/2009 | Mitsui et al. |
| 2009/0286338 A1 | 11/2009 | Coe-Sullivan et al. |
| 2009/0301556 A1 | 12/2009 | Kawano et al. |
| 2009/0321726 A1 | 12/2009 | Thompson |
| 2010/0025662 A1 | 2/2010 | Cho et al. |
| 2010/0044676 A1 | 2/2010 | Sargent et al. |
| 2010/0044767 A1 | 2/2010 | Chaudhry et al. |
| 2010/0059097 A1 | 3/2010 | McDonald et al. |

(56) References Cited

U.S. PATENT DOCUMENTS

| | | |
|---|---|---|
| 2010/0133418 A1 | 6/2010 | Sargent et al. |
| 2010/0133434 A1 | 6/2010 | Meng et al. |
| 2010/0133522 A1 | 6/2010 | Pieh et al. |
| 2010/0141122 A1 | 6/2010 | Begley et al. |
| 2010/0181552 A1 | 7/2010 | So |
| 2010/0229921 A1 | 9/2010 | Farris et al. |
| 2010/0233842 A1 | 9/2010 | Grein et al. |
| 2010/0243053 A1 | 9/2010 | Coe-Sullivan et al. |
| 2010/0282309 A1 | 11/2010 | Pschirer et al. |
| 2010/0294936 A1 | 11/2010 | Boeberl et al. |
| 2010/0302419 A1 | 12/2010 | Den Boer et al. |
| 2010/0326506 A1 | 12/2010 | Lifshitz et al. |
| 2011/0012091 A1 | 1/2011 | Forrest et al. |
| 2011/0031399 A1 | 2/2011 | So |
| 2011/0031403 A1 | 2/2011 | So |
| 2011/0049489 A1 | 3/2011 | Forrest et al. |
| 2011/0068330 A1 | 3/2011 | Akimoto et al. |
| 2011/0073835 A1 | 3/2011 | Ren et al. |
| 2011/0079706 A1 | 4/2011 | Michalewicz |
| 2011/0114921 A1 | 5/2011 | Yang et al. |
| 2011/0116078 A1 | 5/2011 | Cho et al. |
| 2011/0140075 A1 | 6/2011 | Zhou et al. |
| 2011/0248249 A1 | 10/2011 | Forrest et al. |
| 2011/0303906 A1 | 12/2011 | Goldmann |
| 2012/0068140 A1 | 3/2012 | Greenham et al. |
| 2012/0126204 A1 | 5/2012 | So et al. |
| 2012/0187295 A1 | 7/2012 | So et al. |
| 2012/0193689 A1 | 8/2012 | Park et al. |
| 2012/0241723 A1 | 9/2012 | Klem et al. |
| 2012/0286296 A1 | 11/2012 | So et al. |
| 2013/0044250 A1 | 2/2013 | Senda et al. |
| 2013/0206988 A1 | 8/2013 | So |
| 2013/0215496 A1 | 8/2013 | Ban et al. |
| 2014/0054540 A1 | 2/2014 | Zhou et al. |
| 2014/0060613 A1 | 3/2014 | So et al. |
| 2014/0111652 A1 | 4/2014 | So et al. |
| 2014/0326921 A1 | 11/2014 | Lu et al. |
| 2014/0353502 A1 | 12/2014 | So et al. |
| 2014/0367572 A1 | 12/2014 | So et al. |
| 2015/0001395 A1 | 1/2015 | So et al. |
| 2015/0372046 A1 | 12/2015 | Kim et al. |

FOREIGN PATENT DOCUMENTS

| | | | |
|---|---|---|---|
| CN | 1773732 A | | 5/2006 |
| CN | 1806343 A | | 7/2006 |
| CN | 1856888 A | | 11/2006 |
| CN | 101340749 A | | 1/2009 |
| CN | 101405888 A | | 4/2009 |
| CN | 101421664 A | | 4/2009 |
| CN | 101558348 A | | 10/2009 |
| CN | 101794834 A | | 8/2010 |
| CN | 101872793 A | | 10/2010 |
| CN | 102725616 A | | 10/2012 |
| EP | 0 508 970 A1 | | 10/1992 |
| EP | 0 848 433 A2 | | 6/1998 |
| EP | 0 569 527 B1 | | 6/2002 |
| EP | 1 351 558 A1 | | 10/2003 |
| EP | 1 498 960 A2 | | 1/2005 |
| JP | S58-215081 A | | 12/1983 |
| JP | S60-030163 A | | 2/1985 |
| JP | S61-149831 A | | 7/1986 |
| JP | S63-088872 A | | 4/1988 |
| JP | S64-012583 A | | 1/1989 |
| JP | H02-016421 A | | 1/1990 |
| JP | H02-224279 A | | 9/1990 |
| JP | H03-079693 A | | 4/1991 |
| JP | H07-122762 A | | 5/1995 |
| JP | H07-175420 A | | 7/1995 |
| JP | H08-007096 A | | 1/1996 |
| JP | H08-007096 B2 | | 1/1996 |
| JP | H10-065200 A | | 3/1998 |
| JP | H10-242493 A | | 9/1998 |
| JP | H11-329736 A | | 11/1999 |
| JP | 2000-277265 A | | 10/2000 |
| JP | 2000-349365 A | | 12/2000 |
| JP | 2001-006876 A | | 1/2001 |
| JP | 2001-076882 A | | 3/2001 |
| JP | 2002-523904 A | | 7/2002 |
| JP | 2002-340668 A | | 11/2002 |
| JP | 2003-083809 A | | 3/2003 |
| JP | 2003-178887 A | | 6/2003 |
| JP | 2004-511911 A | | 4/2004 |
| JP | 2005-522005 A | | 7/2005 |
| JP | 2005-266537 A | | 9/2005 |
| JP | 2005-277113 A | | 10/2005 |
| JP | 2006-013103 A | | 1/2006 |
| JP | 2006-066395 A | | 3/2006 |
| JP | 2006-128437 A | | 5/2006 |
| JP | 2006-518110 A | | 8/2006 |
| JP | 2006-251555 A | | 9/2006 |
| JP | 2007-519237 A | | 7/2007 |
| JP | 2008-016831 A | | 1/2008 |
| JP | 2008-053736 A | | 3/2008 |
| JP | 2008-523615 A | | 7/2008 |
| JP | 2009-509129 A | | 3/2009 |
| JP | 2009-520358 A | | 5/2009 |
| JP | 2009-527108 A | | 7/2009 |
| JP | 2009-192919 A | | 8/2009 |
| JP | 2009-531837 A | | 9/2009 |
| JP | 2009-253173 A | | 10/2009 |
| JP | 2009-272528 A | | 11/2009 |
| JP | 2010-506386 A | | 2/2010 |
| JP | 2010-067642 A | | 3/2010 |
| JP | 2010-067802 A | | 3/2010 |
| JP | 2010-087205 A | | 4/2010 |
| JP | 2010-192931 A | | 9/2010 |
| JP | 2010-263030 A | | 11/2010 |
| JP | 2010-534409 A | | 11/2010 |
| JP | 2011-098948 A | | 5/2011 |
| JP | 2012-524991 A | | 10/2012 |
| JP | 2013-512439 A | | 4/2013 |
| KR | 1020090080056 A | | 7/2009 |
| TW | 200637425 A | | 10/2006 |
| TW | 200847449 A | | 12/2008 |
| TW | 201041203 A | | 11/2010 |
| WO | WO 02/099896 A1 | | 12/2002 |
| WO | WO 03/084292 A1 | | 10/2003 |
| WO | WO 2004/073082 A1 | | 8/2004 |
| WO | WO 2005/069387 A1 | | 7/2005 |
| WO | WO 2005/101530 A1 | | 10/2005 |
| WO | WO 2006/130717 A2 | | 12/2006 |
| WO | WO 2007/017475 A1 | | 2/2007 |
| WO | WO 2007/095386 A1 | | 8/2007 |
| WO | WO 2007/102051 A2 | | 9/2007 |
| WO | WO 2007/131126 A2 | | 11/2007 |
| WO | WO 2008/042859 A2 | | 4/2008 |
| WO | WO 2008/054845 A2 | | 5/2008 |
| WO | WO 2008/140601 A1 | | 11/2008 |
| WO | WO 2009/074993 A2 | | 6/2009 |
| WO | WO 2009/116511 A1 | | 9/2009 |
| WO | WO 2010/070563 A2 | | 6/2010 |
| WO | WO 2010/120393 A2 | | 10/2010 |
| WO | WO 2010/142575 A2 | | 12/2010 |
| WO | WO 2010/142947 A1 | | 12/2010 |
| WO | WO 2011/033974 A1 | | 3/2011 |
| WO | WO 2011/066396 A2 | | 6/2011 |
| WO | WO 2012/168192 A2 | | 12/2012 |
| WO | WO 2012/170457 A2 | | 12/2012 |
| WO | WO 2012/178071 A2 | | 12/2012 |
| WO | WO 2013/003850 A2 | | 1/2013 |

OTHER PUBLICATIONS

International Search Report dated Jun. 25, 2008 in connection with Application No. PCT/US2007/080104.

International Preliminary Report on Patentability dated Mar. 31, 2009 in connection with Application No. PCT/US2007/080104.

International Search Report and Written Opinion dated Jul. 29, 2011 in connection with Application No. PCT/US2010/058015.

Extended European Search Report dated May 27, 2016 for Application No. EP 11787262.2.

(56) References Cited

OTHER PUBLICATIONS

International Search Report and Written Opinion dated Jan. 4, 2012, in connection with Application No. PCT/US2011/037772.
International Search Report and Written Opinion dated Nov. 24, 2014 in connection with Application No. PCT/US2014/012722.
Third Party Observation dated Feb. 12, 2015 in connection with Application No. PCT/US2014/012722.
Extended European Search Report dated Nov. 3, 2014 in connection with Application No. 11843638.5.
International Search Report and Written Opinion dated Mar. 6, 2012 in connection with Application No. PCT/US2011/056180.
Extended European Search Report dated Apr. 20, 2015 in connection with Application No. EP 12797523.3.
International Search Report and Written Opinion dated Jan. 29, 2013 in connection with Application No. PCT/US2012/040980.
Extended European Search Report dated Feb. 4, 2015 in connection with Application No. EP 12804913.7.
International Search Report and Written Opinion dated Jan. 7, 2013 in connection with Application No. PCT/US2012/045272.
International Search Report and Written Opinion dated Mar. 16, 2012 in connection with Application No. PCT/US2011/056178.
International Search Report and Written Opinion dated Nov. 23, 2012 in connection with Application No. PCT/US2012/026920.
Extended European Search Report dated Sep. 8, 2014 in connection with Application No. 1276466.1.
International Search Report and Written Opinion dated Oct. 31, 2012 in connection with Application No. PCT/US2012/031988.
[No Author Listed] OLED Display for Thermal Imaging Helmet, Military and Aerospace Electronics. Oct. 7, 2003. http://www.militaryaerospace.com/articles/2003/10/oled-display-for-thermal-imagin-helmut [last accessed Dec. 8, 2014]. 2 pages.
Ban et al., Near-infrared to visible light optical upconversion by direct tandem integration of organic light-emitting diode and inorganic photodetector. Appl Phys Lett. Feb. 27, 2007;90(9):93108.1-3.
Carlson et al., Amorphous silicon solar cell. Appl Phys Lett. 1976;28:671-3.
Chen et al., Near-infrared inorganic/organic optical upconverter with an external power efficiency of >100%. Adv Mater. Nov. 16, 2010;22(43):4900-4. doi: 10.1002/adma.201001946.
Chen et al., Near-infrared optical upconverter based on i-In0.53Ga0.47As/C60 photovoltaic heterojunction. Electron Lett. Jul. 2009;45(14):753-5.
Chikamatsu et al., Light up-conversion from near-infrared to blue using a photoresponsive organic light-emitting device. Appl Phys Lett. Jul. 22, 2002;81(4):769-71.
Gong et al., High-Detectivity Polymer Photodetectors with Special Response from 300 nm to 1450 nm. Sci. Sep. 25, 2009;325:1665-7.
Gong et al., Semiconducting Polymer Photodetectors with Electron and Hole Blocking Layers: High Detectivity in the Near-Infrared. Sensors. Jul. 1, 2010;10:6488-96.
Im et al., Near-infrared photodetection based on PbS colloidal quantum dots/organic hole conductor. Org Electron. Jan. 4, 2010;11(4):696-9.
Kim et al., Organic infrared upconversion device. Adv Mater. May 25, 2010;22(20):2260-3. doi: 10.1002/adma.200903312.
Kim et al., PbSe nanocrystal-based infrared-to-visible up-conversion device. Nano Lett. May 11, 2011;11(5):2109-13. doi: 10.1021/nl200704h. Epub Apr. 19, 2011.
Konstantatos et al., Solution-Processed Quantum Dot Photodetectors. Proc IEEE. Oct. 2009;97(10):1666-83.
Konstantatos, Sensitive solution-processed quantum dot photodetectors. PhD Thesis Graduate Dept of Electrical and Computer Engineering. University of Toronto. 2008:133 pages.
Luo et al., Optical upconverter with integrated heterojunction phototransistor and light-emitting diode. Appl Phys Lett. Feb. 2006;88(7):73501.1-3.
McDonald et al., Solution-processed PbS quantum dot infrared photodetectors and photovoltaics. Nat Mater. Feb. 2005;4:138-43. Supplementary Figure. 1 page.

Mustafa et al., Solution processed nickel oxide anodes for organic photovoltaic devices. Appl Phys Lett. 2014;104(6):e063302.1-5.
Ni et al., Organic light-emitting diode with TiOPc layer—A new multifunctional optoelectronic device. Jpn J Appl Phys. 2001;40:L948-51. doi:10.1143/JJAP.40.L948.
Overton, Near-IR image uses quantum-dot-sensitized photodiodes. Laser Focus World. Sep. 2009:25-8.
Sarasqueta et al., Organic and inorganic blocking layers for solution-processed colloidal PbSe nanocrystal infrared photodetectors. Adv Funct Mater. 2011;21(1):167-71.
Sargent, Infrared Quantum Dots. Adv Mater. Mar. 8, 2005;17(5):515-22.
Wagner et al., Change of electrochemical impedance spectra (EIS) with time during CO-poisoning of the Pt-anode in a membrane fuel cell. J Power Science. Mar. 10, 2004;127(1-2):341-7.
Wang et al., Correlation between mechanical stress and optical properties of SiO2/Ta2O5 multilayer UV narrow-bandpass filters deposited by plasma ion-assisted deposition. Proc of SPIE. Aug. 2005;5870:58700e.1-9.
Xie et al., InAs/InP/ZnSe Core/Shell/Shell Quantum Dots as Near-Infrared Emitters: Bright, Narrow-Band, Non-Cadmium Containing, and Biocompatible. Nano Res. 2008;1:457-64.
Yase et al., Organic Light-emitting Devices with Photoresponsive Layer. Pacific Rim Conference on Lasers and Electro-Optics. Tokyo, Japan. Jul. 11-15, 2005;569-70.
U.S. Appl. No. 11/865,505, filed Oct. 1, 2007, So.
U.S. Appl. No. 14/247,130, filed Apr. 7, 2014, So et al.
U.S. Appl. No. 14/763,394, filed Jul. 24, 2015, Kim et al.
U.S. Appl. No. 13/272,995, filed Oct. 13, 2011, So et al.
U.S. Appl. No. 14/124,136, filed Dec. 5, 2013, So et al.
U.S. Appl. No. 14/009,945, filed Nov. 18, 2013, So et al.
PCT/US2007/080104, Jun. 24, 2008, International Search Report.
PCT/US2007/080104, Mar. 31, 2009, International Preliminary Report on Patentability.
PCT/US2010/058015, Jul. 29, 2011, International Search Report and Written Opinion.
EP 11787262.2, May 27, 2016, Extended European Search Report.
PCT/US2011/037772, Jan. 4, 2012, International Search Report and Written Opinion.
PCT/US2014/012722, Nov. 24, 2014, International Search Report and Written Opinion.
PCT/US2014/012722, Feb. 12, 2015, Third Party Observation.
EP 11843638.5, Nov. 3, 2014, Extended European Search Report.
PCT/US2011/056180, Mar. 6, 2012, International Search Report and Written Opinion.
EP 12797523.3, Apr. 20, 2015, Extended European Search Report.
PCT/US2012/040980, Jan. 29, 2013, International Search Report and Written Opinion.
EP 12804913.7, Feb. 4, 2015, Extended European Search Report.
PCT/US2012/045272, Jan. 7, 2013, International Search Report and Written Opinion.
PCT/US2011/056178, Mar. 16, 2012, International Search Report and Written Opinion.
PCT/US2012/026920, Nov. 23, 2012, International Search Report and Written Opinion.
EP 1276466.1, Sep. 8, 2014, Extended European Search Report.
PCT/US2012/031988, Oct. 31, 2012, International Search Report and Written Opinion.
Extended European Search Report dated Jul. 19, 2016 in connection with Application No. EP 10833930.0.
Extended European Search Report dated Jul. 25, 2016 in connection with Application No. EP 14791448.5.
Extended European Search Report for European Application No. 11859661.8 dated Jun. 26, 2017.
International Search Report and Written Opinion dated Mar. 3, 2017 for Application No. PCT/US2016/037056.
Ban et al., 1.5 μm Optical Up-Conversion: Wafter Fusion and Related Issues. Proc SPIE. 2004;5543:47-55.
Chikamatsu et al., Photoresponsive organic electroluminescent devices. J Photochem Photobiol A: Chem. Jun. 1, 2003;158(2-3):215-8.
Lepnev et al., Two-diode organic light amplifiers/converters and peculiarities of photocurrent multiplaction. Synth Met. Apr. 5, 2006;156(7-8):624-32.

(56) References Cited

OTHER PUBLICATIONS

Yang et al., Semiconductor infrared up-conversion devices. Prog Quant Electr. 2011;35:77-108.
Yin et al., Colloidal nanocrystal synthesis and the organic-inorganic interface. Nature. Sep. 29, 2005;437:664-70.
Extended European Search Report for European Application No. 12825553.6 dated Dec. 12, 2017.
[No Author Listed], Background Information on CCD and CMOS Technology. Ted Pella, Inc. https://www.tedpella.com/cameras_htmlccd_cmos.htm 2009. p. 1-3.

* cited by examiner

METHOD AND APPARATUS FOR DETECTING INFRARED RADIATION WITH GAIN

CROSS-REFERENCE TO RELATED APPLICATION

The present application claims the benefit of U.S. Provisional Patent Application Ser. No. 61/503,317, filed Jun. 30, 2011, the disclosure of which is hereby incorporated by reference in its entirety, including any figures, tables, or drawings.

BACKGROUND OF INVENTION

Infrared (IR) light is not visible to the human eye, but an IR photodetector can detect IR light. IR photodetectors have a wide range of potential applications, including night vision, range finding, security, and semiconductor wafer inspections. IR can refer to radiation having wavelengths longer than visible light (>0.7 μm) up to about 14 μm.

BRIEF SUMMARY

Embodiments of the subject invention relate to a photodetector capable of producing gain (i.e., a photodetector with gain). The photodetector can be, for example, an infrared (IR) photodetector. That is, the photodetector can be sensitive to at least a portion of light in the IR region. Embodiments of the subject invention also pertain to an IR-to-visible upconversion device. The IR-to-visible upconversion device can include a photodetector and an organic light-emitting device (OLED).

In an embodiment, a photodetector with gain can include a first electrode, a light sensitizing layer on the first electrode, an electron blocking/tunneling layer on the light sensitizing layer, and a second electrode on the electron blocking/tunneling layer.

In another embodiment, a method of fabricating a photodetector with gain can include: forming a first electrode; forming a light sensitizing layer on the first electrode; forming an electron blocking/tunneling layer on the light sensitizing layer; and forming a second electrode on the electron blocking/tunneling layer.

In another embodiment, an IR-to-visible upconversion device can include a photodetector with gain and an OLED coupled to the photodetector with gain. The photodetector with gain can include a first electrode, a light sensitizing layer on the first electrode, an electron blocking/tunneling layer on the light sensitizing layer, and a second electrode on the electron blocking/tunneling layer.

In another embodiment, a method of forming an IR-to-visible upconversion device can include: forming a photodetector with gain; forming an OLED; and coupling the OLED to the photodetector with gain. Forming the photodetector with gain can include: forming a first electrode; forming a light sensitizing layer on the first electrode; forming an electron blocking/tunneling layer on the light sensitizing layer; and forming a second electrode on the electron blocking/tunneling layer.

DETAILED DISCLOSURE

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present. When the term "directly on" is used herein, when referring to layers, regions, patterns, or structures, it is understood that the layer, region, pattern or structure is directly on another layer or structure, such that no intervening layers, regions, patterns, or structures are present.

When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

When the term "sensitive" is used herein, in conjunction with describing a photodetector being sensitive to a certain type of light or to photons having a wavelength of a given value or within a given range, it is understood that the photodetector is capable of absorbing the light to which it is sensitive and generating a carrier. When the term "not sensitive" or "insensitive" is used herein, in conjunction with describing a photodetector not being sensitive or being insensitive to a certain type of light or to photons having a wavelength of a given value or within a given range, it is understood that the photodetector is not able to absorb the light to which it is not sensitive and generate a carrier from the absorption of the light.

Embodiments of the subject invention relate to a photodetector capable of producing gain (i.e., a photodetector with gain). The photodetector can be, for example, an infrared (IR) photodetector. That is, the photodetector can be sensitive to at least a portion of light in the IR region. In a specific embodiment, the photodetector is sensitive to at least a portion of the wavelength range from 0.7 µm to 14 µm, inclusive or non-inclusive. In certain embodiments, the photodetector can be sensitive to IR light and can be insensitive to visible light. For example, a light sensitizing layer of the photodetector can be insensitive to at least a portion of the wavelength range from 0.4 µm to 0.7 µm. In an embodiment, a light sensitizing layer of the photodetector can be insensitive to the entire wavelength range from 0.4 µm to 0.7 µm, inclusive or non-inclusive.

Figure 1A:
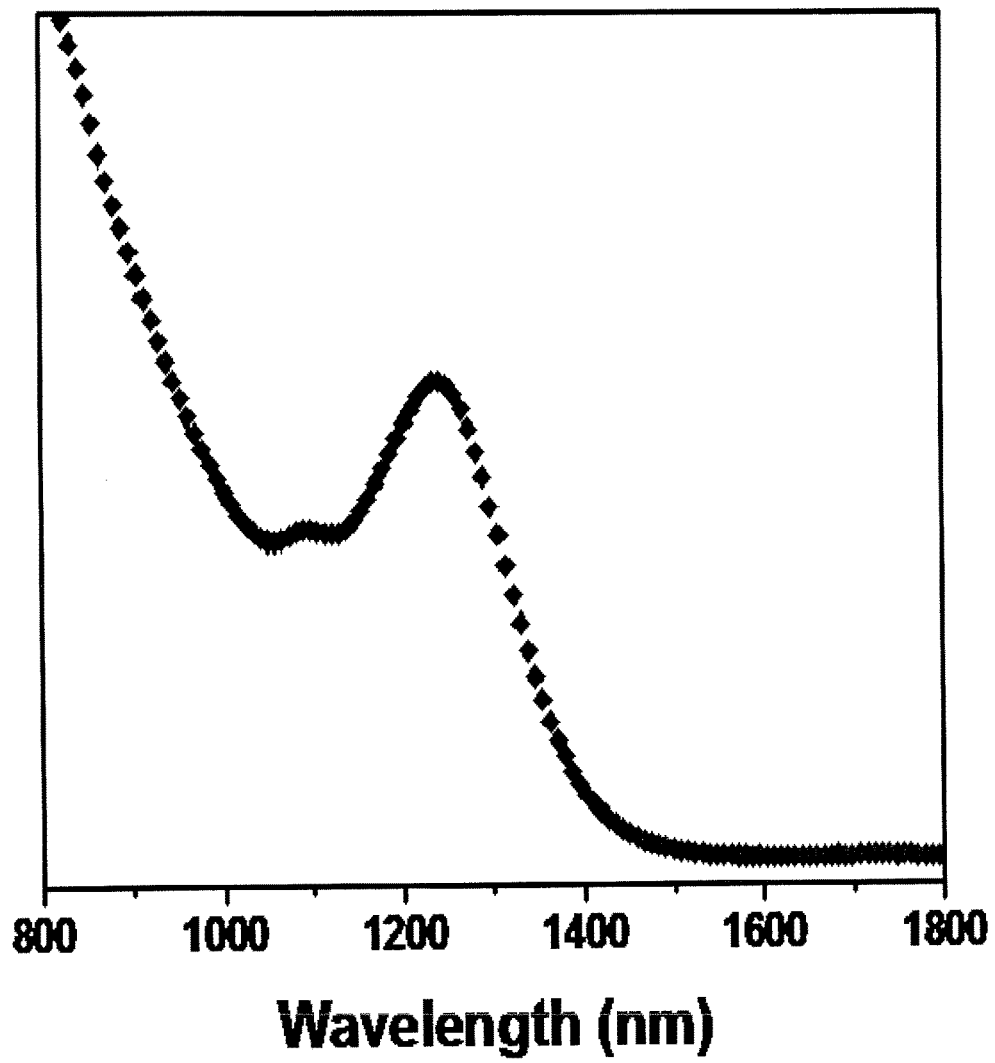
FIG. 1A shows an absorption spectrum of PbS nanocrystals which can be used as an IR sensitizing layer according to an embodiment of the subject invention.
Figure 1B:
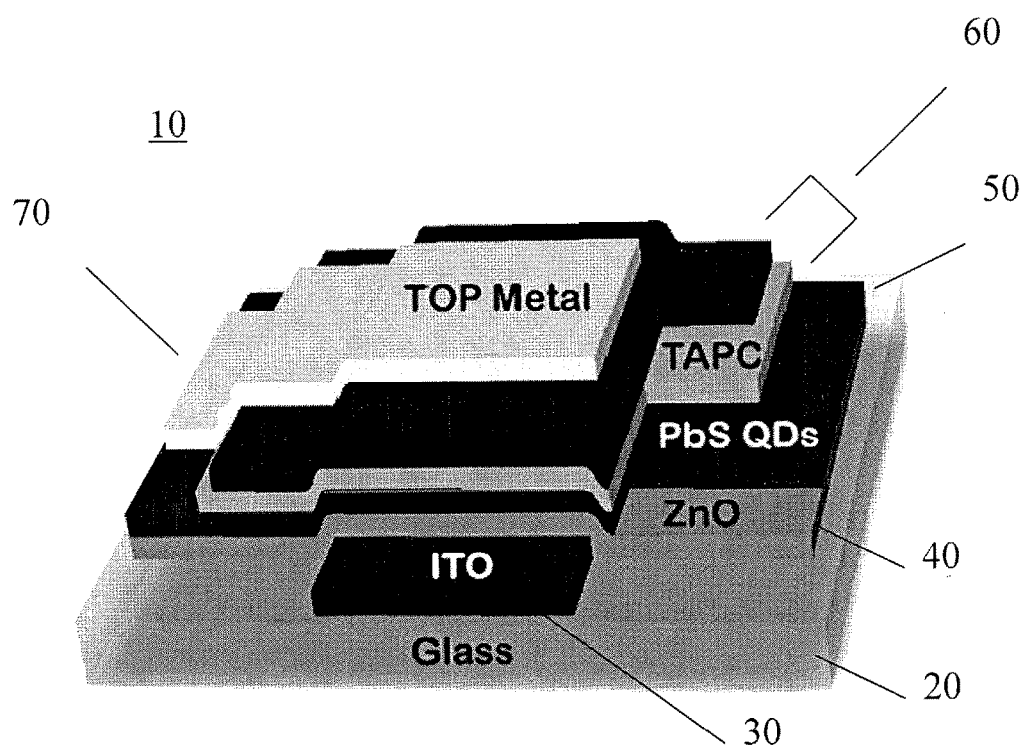
FIG. 1B shows a schematic perspective view of a photodetector according to an embodiment of the subject invention.

Referring to FIG. 1B, in an embodiment, a photodetector 10 can include a first electrode 30, a light sensitizing layer 50, an electron blocking/tunneling layer 60, and a second electrode 70. The photodetector 10 can also optionally include a substrate 20 and/or a hole blocking layer 40. The substrate 20 can be, for example, a glass substrate. Though FIG. 1B includes labels of certain materials for the various components, these are intended for demonstrative purposes only and embodiments of the subject invention are not limited thereto.

The first electrode 30 can be a cathode, and the second electrode 70 can be an anode. In an alternative embodiment, the first electrode 30 can be an anode, and the second electrode 70 can be a cathode. In certain embodiments, the first electrode 30 and/or the second electrode 70 can be transparent to at least a portion of visible and/or at least a portion of IR light, though embodiments are not limited thereto.

The first electrode 30 can include one or more of the following materials: indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and CsCO$_3$/ITO. In a particular embodiment, the first electrode 30 can be an ITO electrode. The second electrode 70 can include one or more of the following materials: ITO, IZO, ATO, AZO, silver, calcium, magnesium, gold, aluminum, carbon nanotubes, silver nanowire, LiF/Al/ITO, Ag/ITO, and CsCO$_3$/ITO. In a particular embodiment, the second electrode 70 can be a silver electrode.

In certain embodiments, the photodetector 10 can be an IR photodetector and the light sensitizing layer 50 can be an IR sensitizing layer. That is, the IR sensitizing layer can be sensitive to at least a portion of light in the IR range. The light sensitizing layer 50 can include, for example, one or more of the following materials: PbS nanocrystals (quantum dots), PbSe nanocrystals (quantum dots), PCTDA, SnPc, SnPc:C60, AlNCl, AlPcCl:C60, TiOPc, TiOPc:C60, PbSe, PbS, InAs, InGaAs, Si, Ge, and GaAs.

FIG. 1A shows an absorption spectrum for PbS nanocrystals as a light sensitizing layer 50. Referring to FIG. 1A, the PbS nanocrystal light sensitizing layer shows absorbance in at least a portion of the IR region.

In an embodiment, the electron blocking/tunneling layer can be a 1,1-bis[(di-4-tolylamino)phenyl]cyclohexane (TAPC)/MoO$_3$ stack layer. The TAPC layer can have a thickness of, for example, 0 nm to 100 nm. The MoO$_3$ layer can have a thickness of, for example, 0 nm to 100 nm.

In an embodiment, the photodetector can include a hole blocking layer, and the hole blocking layer can include one or more of the following materials: ZnO, naphthalene tetracarboxylic anhydride (NTCDA), 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline)aluminum (Alq3), 3,5'-N,N'-dicarbazole-benzene (mCP), C60, tris[3-(3-pyridyl)-mesityl]borane (3TPYMB), and TiO$_2$.

In an exemplary embodiment, the photodetector can include a first electrode, light sensitizing layer on the first electrode, an electron blocking/tunneling layer on the light sensitizing layer, and a second electrode on the electron blocking/tunneling layer. The electron blocking/tunneling layer can be, for example, a TAPC/MoO$_3$ stack layer, and the TAPC/MoO$_3$ stack layer can be positioned such that the TAPC layer is in direct contact with the light sensitizing layer and the MoO$_3$ layer is in direct contact with the second electrode. The light sensitizing layer can be, for example, an IR sensitizing layer and can include, e.g., PbS quantum dots. In a further embodiment, the photodetector can include a hole blocking layer on the first electrode and under the light sensitizing layer.

Figure 2A:
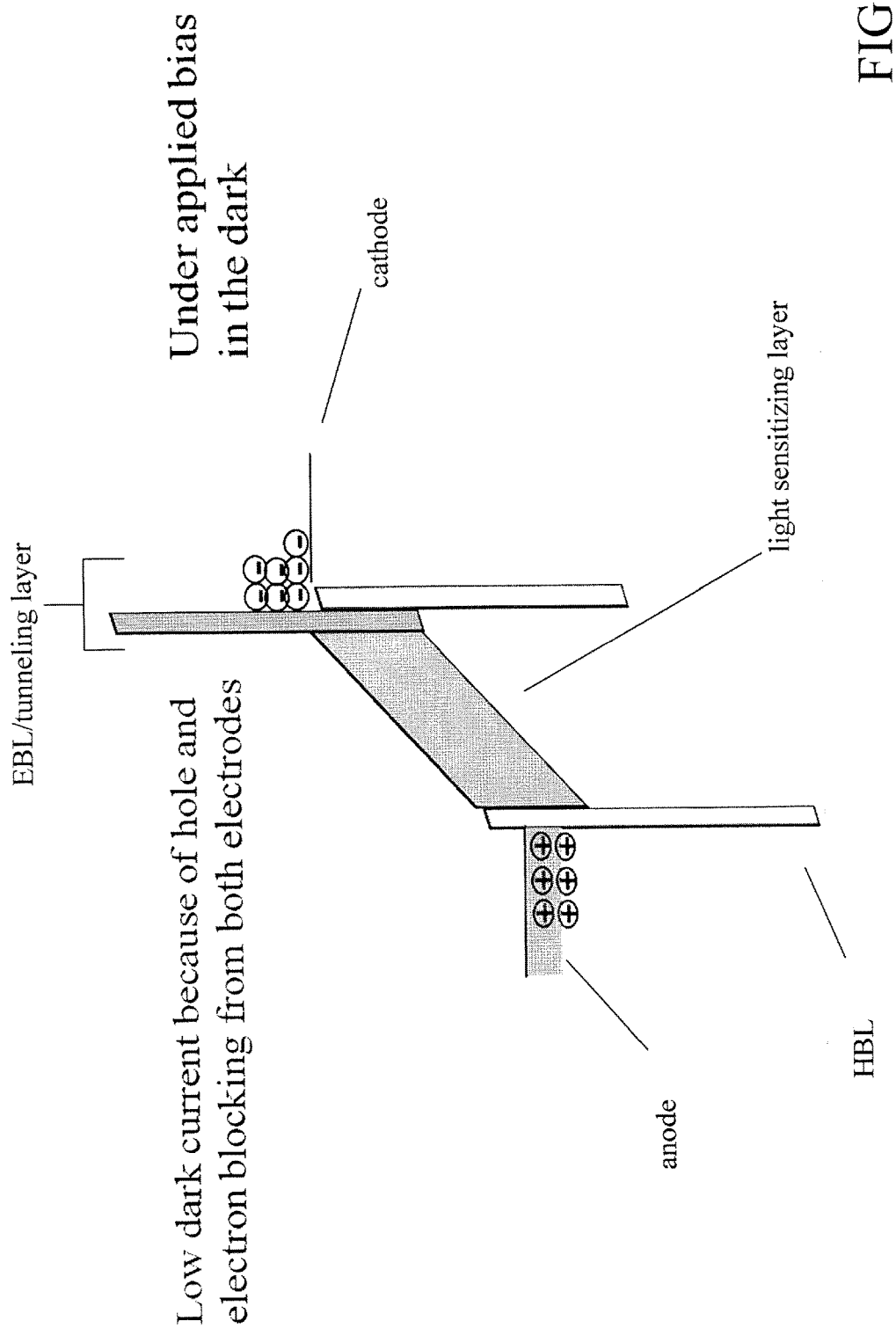
FIG. 2A shows a schematic energy band diagram of a photodetector, according to an embodiment of the subject invention, under applied voltage in the dark.
Figure 2B:
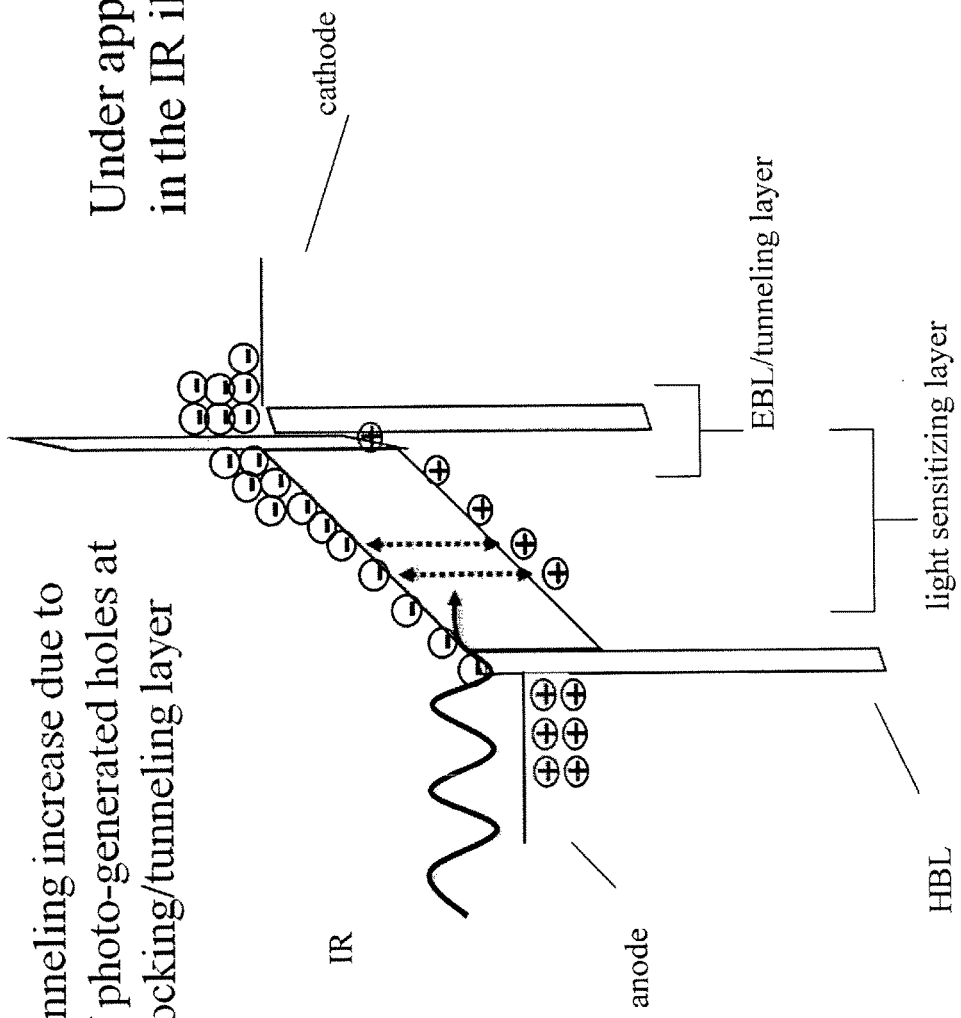
FIG. 2B shows a schematic energy band diagram of a photodetector, according to an embodiment of the subject invention, under applied voltage and IR irradiation.

FIGS. 2A and 2B demonstrate the operating principle of a photodetector according to an embodiment of the subject invention. Referring to FIG. 2A, when a bias is applied in the dark (i.e., no visible and/or IR light), holes are blocked from the first electrode due to hole blocking layer, and electrons are blocked from second electrode due to the electron blocking layer. Referring to FIG. 2B, when the photodetector is irradiated with light (e.g., IR light), the light sensitizing layer (e.g., an IR sensitizing layer) generates electron-hole pairs, and the electrons flow to the first electrode due to the applied bias. The holes are accumulated in bulk trap sites of the electron blocking/tunneling layer, and the accumulated holes reduce the barrier width of the electron blocking/tunneling layer. Thus, the electron tunneling from the second electrode to the light sensitizing layer is enhanced significantly, thus producing gain.

Figure 3A:
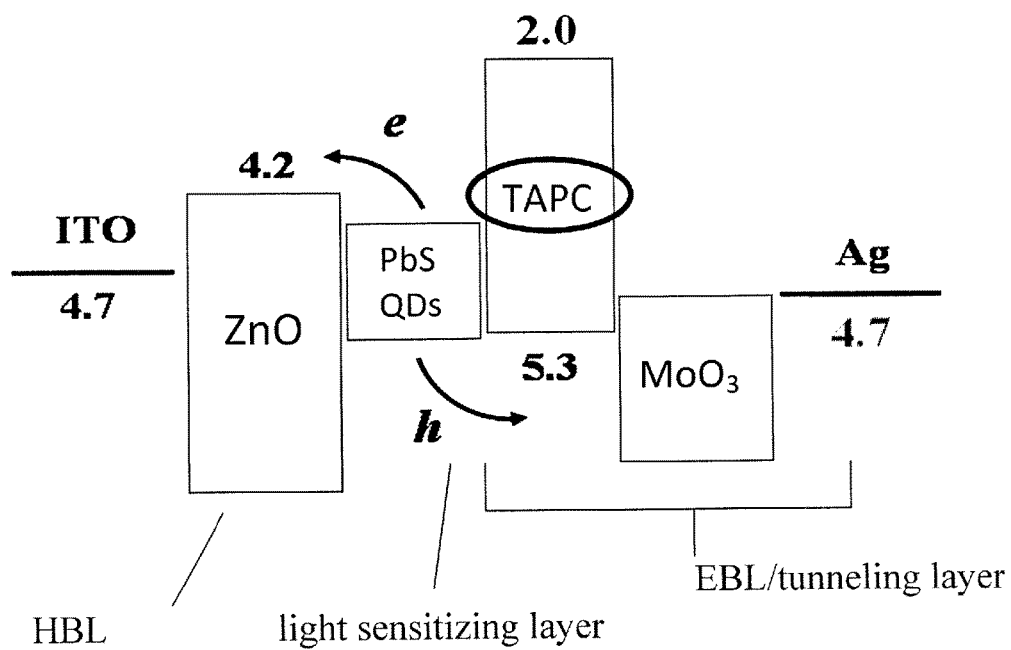
FIG. 3A shows a schematic energy band diagram of a photodetector according to an embodiment of the subject invention.
Figure 3B:
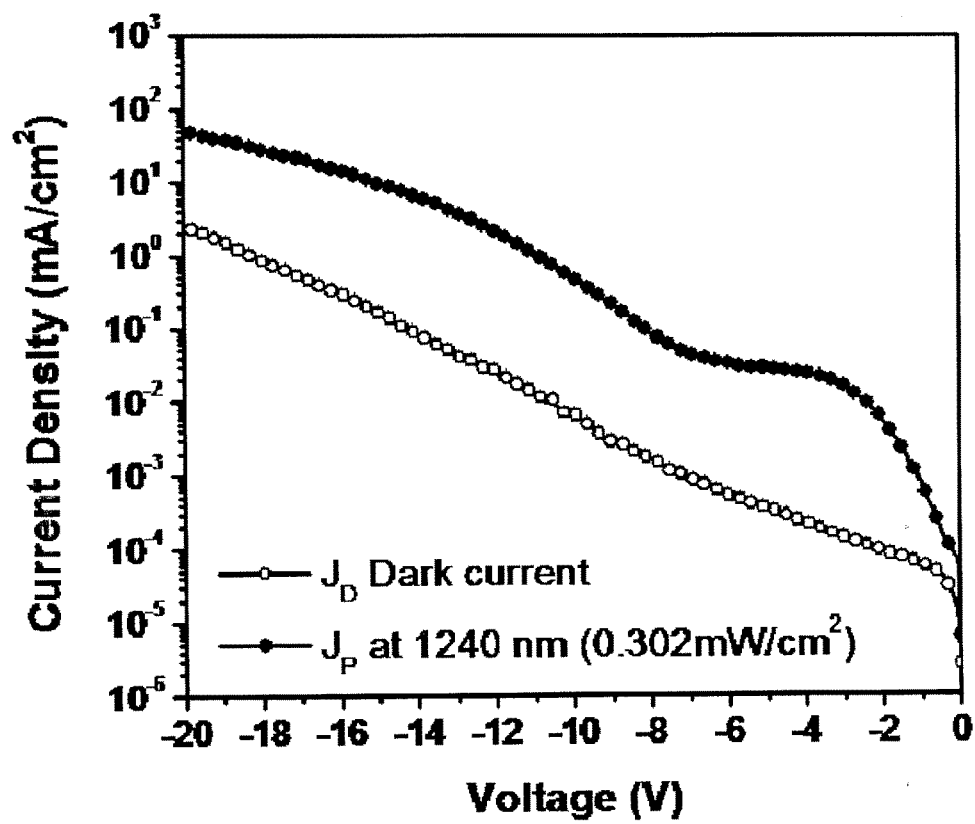
FIG. 3B shows current vs. voltage characteristics for a photodetector according to an embodiment of the subject invention under dark and photo (1240 nm infrared illumination) conditions.

FIG. 3A shows a schematic band diagram of a photodetector according to an embodiment of subject invention, and FIG. 3B shows the dark and photo current density-voltage (J-V) characteristics for a photodetector according to an embodiment of the subject invention.

Figure 4A:
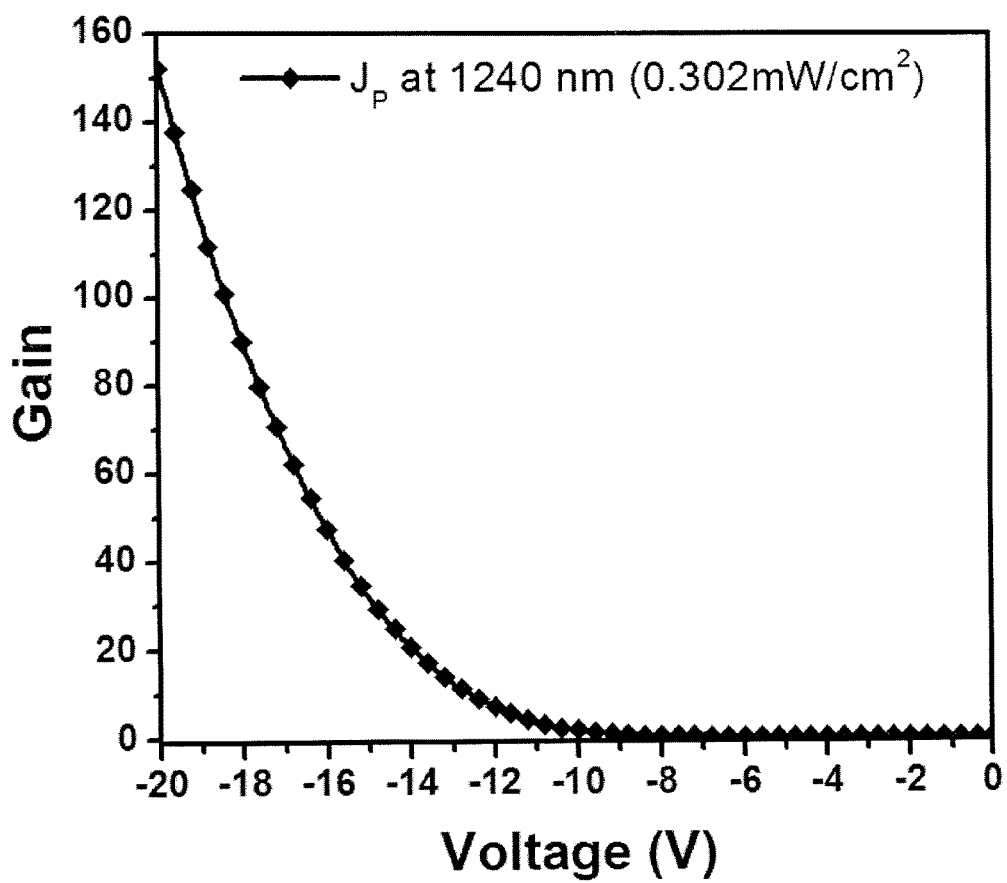
FIG. 4A shows a plot of gain as a function of applied voltage for a photodetector according to an embodiment of the subject invention.
Figure 4B:
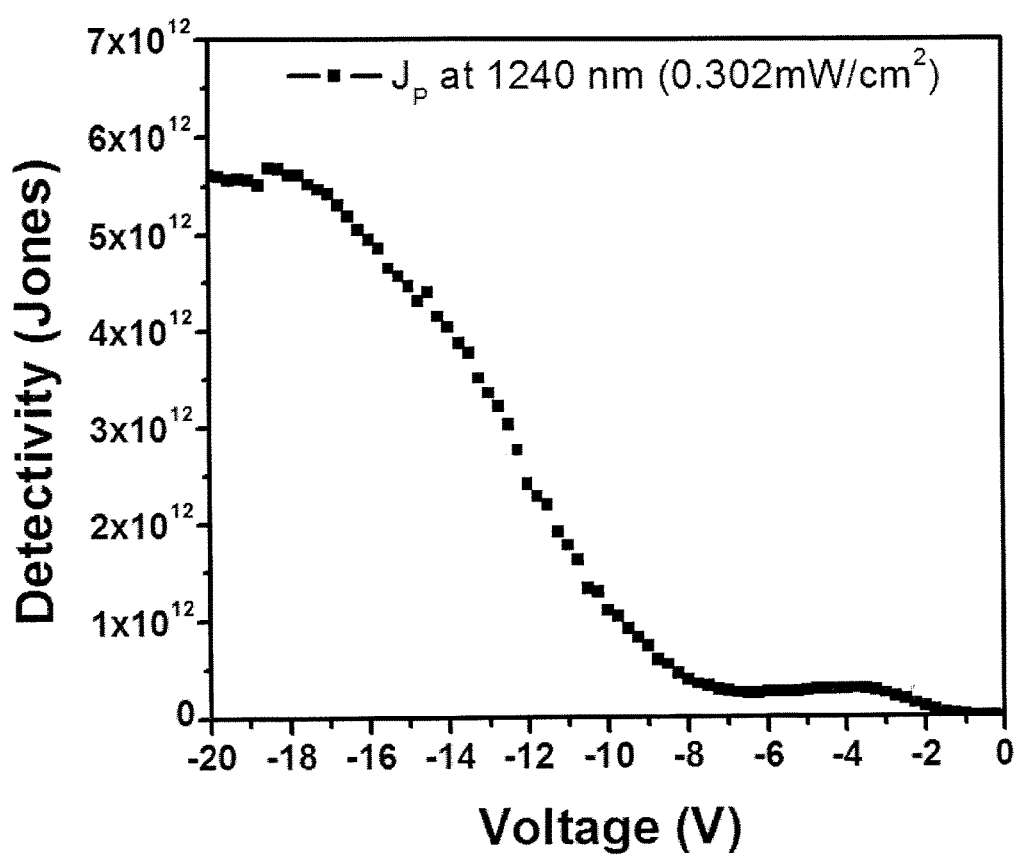
FIG. 4B shows a plot of detectivity as a function of applied voltage on a photodetector according to an embodiment of the subject invention.

FIG. 4A shows a plot of the gain versus the applied voltage for a photodetector according to the subject invention, and FIG. 4B shows a plot of the detectivity versus the applied voltage for a photodetector according to an embodiment of the subject invention. Referring to FIG. 4A, a very high gain can be seen, including a gain of more than 150 at an applied bias of −20 V. Referring to FIG. 4B, the detectivity is saturated to more than $5 \times 10^{12}$ Jones at values of the applied voltage of less than −18 V.

According to embodiments of the subject invention, a photodetector exhibits gain at applied bias (i.e., it is a photodetector with gain). The photodetector can exhibit a gain of, for example, about 150 at an applied bias of −20 V. In various embodiments, the photodetector can exhibit a gain any of the following values or ranges: 2, about 2, at least 2, 3, about 3, at least 3, . . . , 160, about 160, at least 160 (where the " . . . " represents each number between 3 and 160, "about" each number between 3 and 160, and "at least" each number between 3 and 160), or any range having a first endpoint of any number from 2 to 159 and a second endpoint of any number from 3 to 160. The gain values and ranges of the preceding sentence can be exhibited at any applied voltage value from −30 V to 30 V.

Figure 5A:
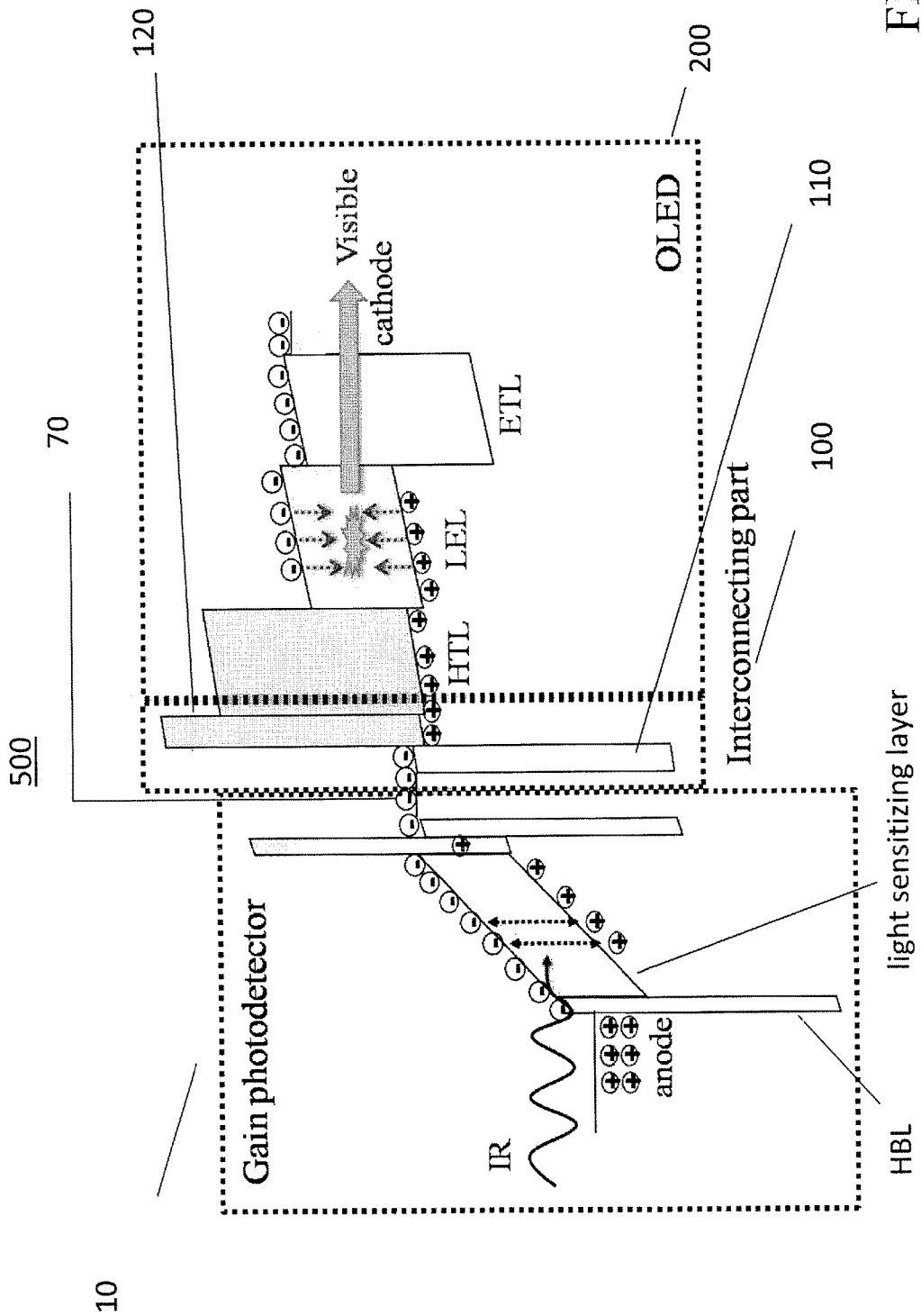
FIG. 5A shows a schematic energy band diagram of an infrared-to-visible upconversion device according to an embodiment of the subject invention.
Figure 5B:
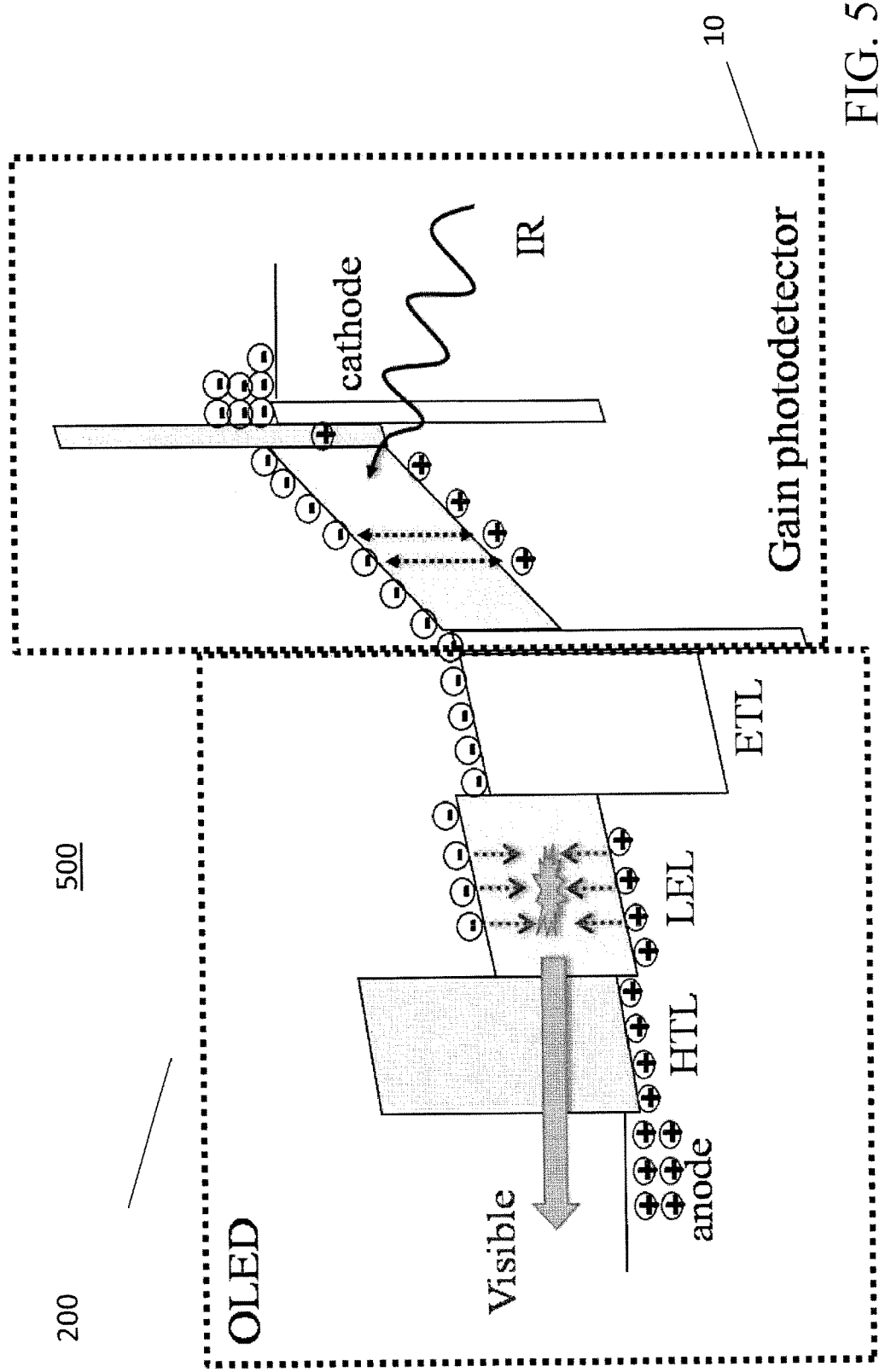
FIG. 5B shows a schematic energy band diagram of an infrared-to-visible upconversion device according to an embodiment of the subject invention.
Figure 5C:
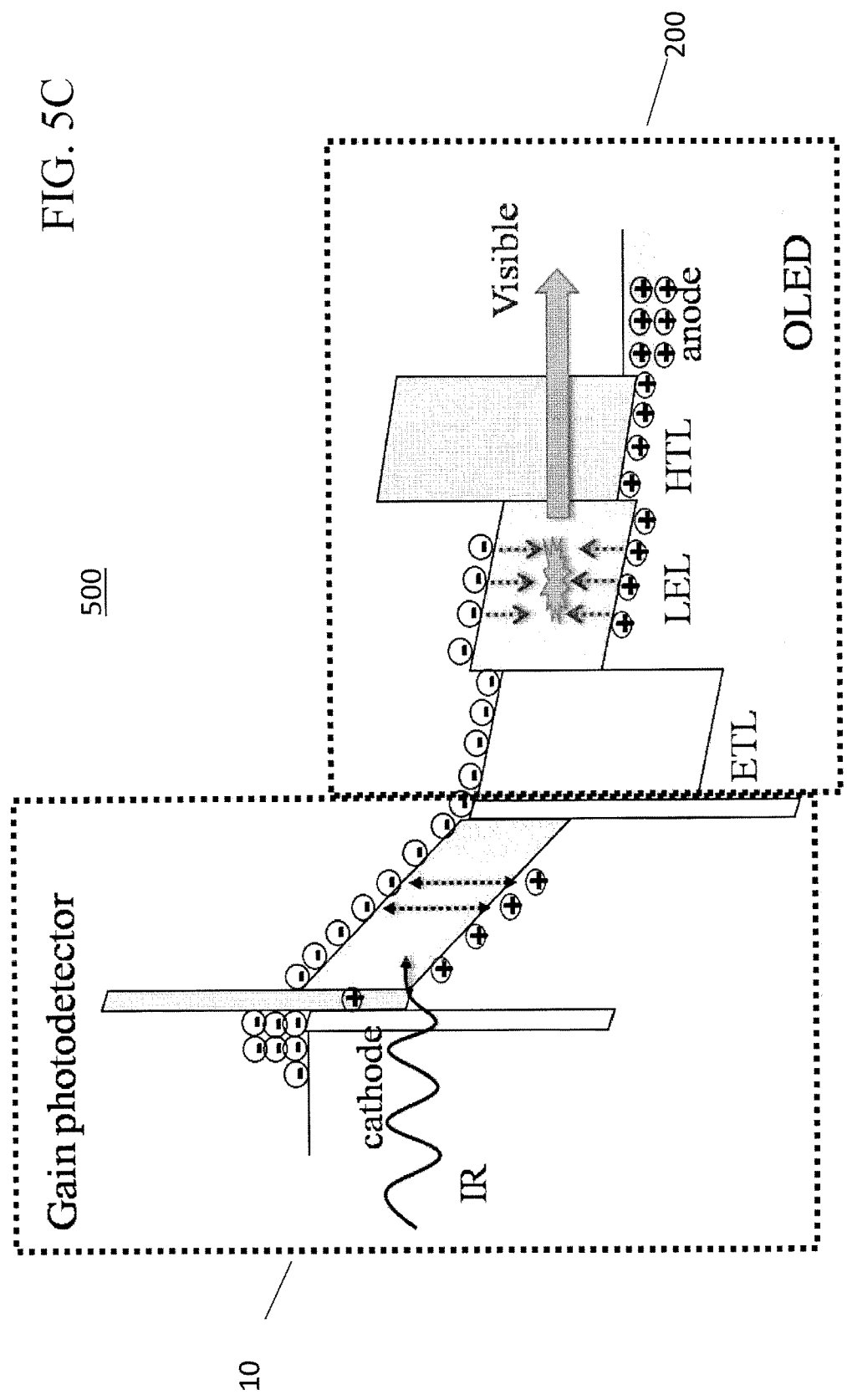
FIG. 5C shows a schematic energy band diagram of an infrared-to-visible upconversion device according to an embodiment of the subject invention.

Referring to FIGS. 5A-5C, embodiments of the subject invention also pertain to an IR-to-visible upconversion device 500. The IR-to-visible upconversion device 500 can include a photodetector 10 and a light-emitting device (LED) 200. In many embodiments, the LED 200 can be an organic LED (OLED). The IR-to-visible upconversion device 500 can be an IR-to-visible upconversion device with gain, and the photodetector 10 can be a photodetector with gain. In specific embodiments, the IR-to-visible upconversion device can include a photodetector with gain, as illustrated in FIGS. 1A-1B, 2A-2B, 3A-3B, and 4A-4B and/or as described in connection with the photodetectors of FIGS. 1A-1B, 2A-2B, 3A-3B, and 4A-4B. The OLED 200 can include at least one electrode, a hole transporting layer (HTL), a light emitting layer (LEL), and an electron transporting layer (ETL).

At least one electrode of the OLED 200 can be transparent to at least a portion of visible light and/or at least a portion of IR light, though embodiments are not limited thereto. Each electrode of the OLED 200 can include one or more of the following materials: ITO, IZO, ATO, AZO, silver, calcium, magnesium, gold, aluminum, carbon nanotubes, silver nanowire, LiF/Al/ITO, Ag/ITO, CsCO$_3$/ITO, and a Mg:Ag/Alq3 stack layer, though embodiments are not limited thereto. The HTL of the OLED 200 can include one or more of the following materials: NPD, TAPC, TFB, TPD, and diamine derivative, though embodiments are not limited thereto. The LEL of the OLED 200 can include one or more of the following materials: Iridium tris(2-phenylpyidine) (Ir(ppy)3), [2-methoxy-5-(2-ethylhexyloxy)-p-phenylenevinylene] (MEH-PPV), Tris-(8-quinolinolato)aluminum) (Alq3), and bis[(4,6-di-fluorophenyl)-pyridinate-]picolinate (Flrpic), though embodiments are not limited thereto. The ETL of the OLED 200 can include one or more of the following materials: BCP, Bphen, 3TPYMB, and Alq3, though embodiments are not limited thereto.

In a particular embodiment, the electrode of the OLED 200 is a Mg:Ag/Alq3 stack layer. The Mg:Ag layer of the Mg:Ag/Alq3 stack layer can have a composition of, for example, Mg:Ag (10:1) and can have a thickness of, for example, less than 30 nm. The Alq3 layer of the Mg:Ag/Alq3 stack layer can have a thickness of, for example, from 0 nm to 200 nm.

The photodetector 10 can be a photodetector with gain as described herein, though only one electrode need be present. That is, the photodetector 10 can include at least one electrode, a light sensitizing layer, and an electron blocking/tunneling layer. The photodetector 10 can also optionally include a substrate and/or a hole blocking layer.

The electrode can include one or more of the following materials: ITO, IZO, ATO, AZO, silver, calcium, magnesium, gold, aluminum, carbon nanotubes, silver nanowire, LiF/Al/ITO, Ag/ITO, and CsCO$_3$/ITO.

In certain embodiments, the photodetector 10 can be an IR photodetector and the light sensitizing layer can be an IR sensitizing layer. The light sensitizing layer can include, for example, one or more of the following materials: PbS nanocrystals (quantum dots), PbSe nanocrystals (quantum dots), PCTDA, SnPc, SnPc:C60, AlPcCl, AlPeCl:C60, TiOPc, TiOPc:C60, PbSe, PbS, InAs, InGaAs, Si, Ge, and GaAs.

In an embodiment, the electron blocking/tunneling layer can be a TAPC/MoO$_3$ stack layer. The TAPC layer can have a thickness of, for example, 0 nm to 100 nm. The MoO$_3$ layer can have a thickness of, for example, 0 nm to 100 nm.

In an embodiment, the photodetector can include a hole blocking layer, and the hole blocking layer can include one or more of the following materials: ZnO, NTCDA, BCP, UGH2, BPhen, Alq3, mCP, 3TPYMB, and TiO$_2$.

Referring to FIG. 5A, in a further embodiment, the IR-to-visible upconversion device 500 can also include an interconnecting part 100 between the photodetector 10 and the OLED 200. The interconnecting part 100 can be positioned such that the electron blocking/tunneling layer of the photodetector 10 is closer than the light sensitizing layer is to the interconnecting part 100, and the HTL of the OLED 200 is closer than the ETL is to the interconnecting part 100. The photodetector 10 can include an electrode under the light sensitizing layer, and that electrode can be an anode. The OLED 200 can include an electrode on the ETL, and that electrode can be a cathode.

In an embodiment, the interconnecting part 100 can include an HBL 110 and an EBL 120. The lowest unoccupied molecular orbital (LUMO) of the HBL 110 of the interconnecting part 100 can be close to the highest occupied molecular orbital (HOMO) of the EBL 120 of the interconnecting part 100. Thus, when a bias is applied, electrons and holes can be generated in the interconnecting part 100. In an embodiment, the LUMO of the HBL 110 of the interconnecting part 100 and the HOMO of the EBL 120 of the interconnecting part 100 can be no more than 1 eV apart. In a further embodiment, the LUMO of the HBL 110 of the interconnecting part 100 and the HOMO of the EBL 120 of the interconnecting part 100 can be no more than 0.5 eV apart. That is, the energy difference between the HOMO of the EBL 120 of the interconnecting part 100 and the LUMO of the HBL 110 of the interconnecting part 100 can be 0.5 eV or less. The interconnecting part 100 can be positioned within the IR-to-visible upconversion device 500 such that the HBL 120 of the interconnecting part 100 can be adjacent to the photodetector 10 and the EBL 120 of the interconnecting part 100 can be adjacent to the OLED 200. In embodiment, the photodetector 10 can include a second electrode 70 on its EBL/tunneling layer, and the HBL 120 of the interconnecting part 100 can be in direct contact with the second electrode 70 of the photodetector 10. The second electrode 70 of the photodetector 10 can be a cathode. The second electrode 70 of the photodetector 10 can include one or more of the following materials: ITO, IZO, ATO, AZO, silver, calcium, magnesium, gold, aluminum, carbon nanotubes, silver nanowire, LiF/Al/ITO, Ag/ITO, and CsCO$_3$/ITO. In a particular embodiment, the second electrode 70 of the photodetector 10 can be a silver electrode. Though the dotted line around the interconnecting part 100 in FIG. 5A extends beyond the HBL 110 and the EBL 120, the interconnecting part does not necessarily include any additional components beyond the HBL 110 and the EBL 120. In certain embodiments, additional components may be present (e.g., one or more electrodes or substrates).

Referring again to FIGS. 5B and 5C, in an embodiment, the IR-to-visible upconversion device 500 does not include an interconnecting part 100, and the photodetector 10 is positioned directly adjacent to the OLED 200. The OLED 200 can be positioned such that the ETL of the OLED 200 is closer to the light sensitizing layer of the photodetector 10 than it is to the electron blocking/tunneling layer of the photodetector 10. In a particular embodiment, the photodetector can include a hole blocking layer adjacent to the light sensitizing layer, and the ETL of the OLED 200 can be positioned adjacent to and in contact with the hole blocking layer of the photodetector 10. The photodetector 10 can include an electrode adjacent to and in contact with the electron blocking/tunneling layer, and the OLED 200 can include an electrode adjacent to and in contact with the HTL. The electrode of the photodetector 10 can be, for example, a cathode, and the electrode of the OLED 200 can be, for example, an anode.

In the IR-to-visible upconversion devices 500 shown in FIGS. 5A-5C, a substrate (not shown) can also be present. In many embodiments, the IR-to-visible upconversion device 500 can be flipped or turned around and still function properly. For example, the substrate can be adjacent to the anode in FIG. 5B and adjacent to the cathode in FIG. 5C, such that FIG. 5B shows a similar configuration to that of FIG. 5C but with the IR-to-visible upconversion device 500 turned around on the substrate. In the IR-to-visible upconversion device 500 depicted in FIG. 5A, the substrate can be adjacent to the anode or the cathode. In a particular embodiment, an IR-to-visible upconversion device 500 can include an interconnecting part 100 (as shown in FIG. 5A), and the substrate can be adjacent to the anode. IR light can be incident on the IR-to-visible upconversion device 500 from any direction, and visible light can be emitted from the IR-to-visible upconversion device 500 in any direction. The OLED 200 can be transparent to at least a portion of light in the IR spectrum, though embodiments are not limited thereto. The photodetector 10 can be transparent to at least a portion of light in the visible spectrum, though embodiments are not limited thereto.

Referring again to FIGS. 5A-5C, the IR-to-visible upconversion device 500 functions by emitting visible light from the OLED 200 when the photodetector 10 absorbs IR light. That is, the light sensitizing layer (e.g., an IR sensitizing layer) of the photodetector 10 absorbs IR light, causing carriers to flow. The carriers flow to the OLED 200, either directly or via an interconnecting part 100, causing the LEL of the OLED 200 to emit visible light. The IR-to-visible upconversion device 500 can include a photodetector 10 with gain and can advantageously exhibit gain.

Embodiments of the subject invention also relate to methods of fabricating a photodetector with gain. The photodetector can be, for example, an IR photodetector. In an embodiment, a method of fabricating a photodetector with gain can include: forming a light sensitizing layer on a first electrode, forming an electron blocking/tunneling layer on the light sensitizing layer, and forming a second electrode on the electron blocking/tunneling layer. The method can also optionally include forming the first electrode on a substrate and/or forming a hole blocking layer on the first electrode such that the light sensitizing layer is formed on the hole blocking layer. The substrate can be, for example, a glass substrate.

The first electrode can be a cathode, and the second electrode can be an anode. In an alternative embodiment, the first electrode can be an anode, and the second electrode can be a cathode. In certain embodiments, the first electrode and/or the second electrode can be transparent to at least a portion of visible and/or at least a portion of IR light, though embodiments are not limited thereto.

The first electrode can include one or more of the following materials: indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and $CsCO_3$/ITO. The second electrode can include one or more of the following materials: ITO, IZO, ATO, AZO, silver, calcium, magnesium, gold, aluminum, carbon nanotubes, silver nanowire, LiF/Al/ITO, Ag/ITO, and $CsCO_3$/ITO.

In certain embodiments, the photodetector can be an IR photodetector and the light sensitizing layer can be an IR sensitizing layer. The light sensitizing layer can include, for example, one or more of the following materials: PbS nanocrystals (quantum dots), PbSe nanocrystals (quantum dots), PCTDA, SnPc, SnPc:C60, AlPcCl, AlPcCl:C60, TiOPc, TiOPc:C60, PbSe, PbS, InAs, InGaAs, Si, Ge, and GaAs.

In an embodiment, the electron blocking/tunneling layer can be a TAPC/$MoO_3$ stack layer. The TAPC layer can be formed to a thickness of, for example, 0 nm to 100 nm. The $MoO_3$ layer can be formed to a thickness of, for example, 0 nm to 100 nm.

In an embodiment, the method can include forming a hole blocking layer, and the hole blocking layer can include one or more of the following materials: ZnO, NTCDA, BCP, UGH2, BPhen, Alq3, 3mCP, 3TPYMB, and $TiO_2$.

In a particular embodiment, the method of fabricating a photodetector can include: forming a light sensitizing layer on a first electrode, forming an electron blocking/tunneling layer on the light sensitizing layer, and forming a second electrode on the electron blocking/tunneling layer. The electron blocking/tunneling layer can be, for example, a TAPC/$MoO_3$ stack layer, and the TAPC/$MoO_3$ stack layer can be formed such that the TAPC layer is formed directly on and in contact with the light sensitizing layer and the $MoO_3$ layer is formed directly on and in contact with the TAPC layer. The second electrode can then be formed directly on and in contact with the $MoO_3$ layer of the TAPC/$MoO_3$ stack layer. The light sensitizing layer can be, for example, an IR sensitizing layer and can include, e.g., PbS quantum dots. In a further embodiment, the method can include forming a hole blocking layer on the first electrode such that the light sensitizing layer is formed directly on and in contact with the hole blocking layer.

Embodiments of the subject invention also relate to methods of detecting radiation using a photodetector with gain. The photodetector can be, for example, an IR photodetector such that the method can detect IR radiation. In an embodiment, a method of using a photodetector with gain to detect radiation can include: providing a photodetector with gain, wherein the photodetector includes a first electrode, a light sensitizing layer, an electron blocking/tunneling layer, and a second electrode. The photodetector can also optionally include a substrate and/or a hole blocking layer. The substrate can be, for example, a glass substrate.

The first electrode can be a cathode, and the second electrode can be an anode. In an alternative embodiment, the first electrode can be an anode, and the second electrode can be a cathode. In certain embodiments, the first electrode and/or the second electrode can be a transparent electrode.

The first electrode can include one or more of the following materials: indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and $CsCO_3$/ITO. The second electrode can include one or more of the following materials: ITO, IZO, ATO, AZO, silver, calcium, magnesium, gold, aluminum, carbon nanotubes, silver nanowire, LiF/Al/ITO, Ag/ITO, and $CsCO_3$/ITO.

In certain embodiments, the photodetector can be an IR photodetector and the light sensitizing layer can be an IR sensitizing layer. The light sensitizing layer can include, for example, one or more of the following materials: PbS nanocrystals (quantum dots), PbSe nanocrystals (quantum dots), PCTDA, SnPc, SnPc:C60, AlPcCl, AlPcCl:C60, TiOPc, TiOPc:C60, PbSe, PbS, InAs, InGaAs, Si, Ge, and GaAs.

In an embodiment, the electron blocking/tunneling layer can be a TAPC/$MoO_3$ stack layer. The TAPC layer can be formed to a thickness of, for example, 0 nm to 100 nm. The MoO$_3$ layer can be formed to a thickness of, for example, 0 nm to 100 nm.

In an embodiment, the photodetector can include a hole blocking layer, and the hole blocking layer can include one or more of the following materials: ZnO, NTCDA, BCP, UGH2, BPhen, Alq3, 3mCP, 3TPYMB, and TiO$_2$.

In a particular embodiment, the photodetector can include: a light sensitizing layer on a first electrode, an electron blocking/tunneling layer on the light sensitizing layer, and a second electrode on the electron blocking/tunneling layer. The electron blocking/tunneling layer can be, for example, a TAPC/MoO$_3$ stack layer, and the TAPC/MoO$_3$ stack layer can be positioned such that the TAPC layer is directly on and in contact with the light sensitizing layer and the MoO$_3$ layer is directly on and in contact with the TAPC layer. The second electrode can then be directly on and in contact with the MoO$_3$ layer of the TAPC/MoO$_3$ stack layer. The light sensitizing layer can be, for example, an IR sensitizing layer and can include, e.g., PbS quantum dots. In a further embodiment, the photodetector can include a hole blocking layer on the first electrode and under the light sensitizing layer.

Embodiments of the subject invention also relate to methods of forming an IR-to-visible upconversion device. The IR-to-visible upconversion device can be an IR-to-visible upconversion device with gain, and the photodetector can be a photodetector with gain. In an embodiment, a method of fabricating an IR-to-visible upconversion device can include: forming a photodetector with gain; forming an LED; and coupling the LED and the photodetector with gain. The LED can be an OLED. Forming the OLED can include: forming at least one electrode, forming a hole transporting layer (HTL), forming a light emitting layer (LEL), and forming an electron transporting layer (ETL).

At least one electrode of the OLED can be transparent to at least a portion of visible and/or at least a portion of IR light, though embodiments are not limited thereto. Each electrode of the OLED can include one or more of the following materials: ITO, IZO, ATO, AZO, silver, calcium, magnesium, gold, aluminum, carbon nanotubes, silver nanowire, LiF/Al/ITO, Ag/ITO, CsCO$_3$/ITO, and a Mg:Ag/Alq3 stack layer, though embodiments are not limited thereto. The HTL of the OLED can include one or more of the following materials: NPD, TAPC, TFB, TPD, and diamine derivative, though embodiments are not limited thereto. The LEL of the OLED can include one or more of the following materials: Ir(ppy)3, MEH-PPV, Alq3, and Flrpic, though embodiments are not limited thereto. The ETL of the OLED can include one or more of the following materials: BCP, Bphen, 3TPYMB, and Alq3, though embodiments are not limited thereto.

In a particular embodiment, the electrode of the OLED is a Mg:Ag/Alq3 stack layer. The Mg:Ag layer of the Mg:Ag/Alq3 stack layer can have a composition of, for example, Mg:Ag (10:1) and can be formed to a thickness of, for example, less than 30 nm. The Alq3 layer of the Mg:Ag/Alq3 stack layer can be formed to a thickness of, for example, from 0 nm to 200 nm.

The photodetector can be a photodetector with gain and can be formed as described herein, though only one electrode need be formed. That is, forming the photodetector can include forming at least one electrode, forming a light sensitizing layer, and forming an electron blocking/tunneling layer. Forming the photodetector can also optionally include proving a substrate and/or forming a hole blocking layer.

The electrode can be formed of one or more of the following materials: ITO, IZO, ATO, AZO, silver, calcium, magnesium, gold, aluminum, carbon nanotubes, silver nanowire, LiF/Al/ITO, Ag/ITO, and CsCO$_3$/ITO.

In certain embodiments, the photodetector can be an IR photodetector and the light sensitizing layer can be an IR sensitizing layer. The light sensitizing layer can be formed of, for example, one or more of the following materials: PbS nanocrystals (quantum dots), PbSe nanocrystals (quantum dots), PCTDA, SnPc, SnPc:C60, AlPcCl, AlPeCl:C60, TiOPc, TiOPc:C60, PbSe, PbS, InAs, InGaAs, Si, Ge, and GaAs.

In an embodiment, the electron blocking/tunneling layer can be a TAPC/MoO$_3$ stack layer. The TAPC layer can be formed to a thickness of, for example, 0 nm to 100 nm. The MoO$_3$ layer can be formed to a thickness of, for example, 0 nm to 100 nm.

In an embodiment, forming the photodetector can include forming a hole blocking layer, and the hole blocking layer can include one or more of the following materials: ZnO, NTCDA, BCP, UGH2, BPhen, Alq3, mCP, 3TPYMB, and TiO$_2$.

In a further embodiment, coupling the photodetector with gain to the OLED can include coupling the photodetector with gain to an interconnecting part and coupling the OLED to the interconnecting part. The photodetector can be coupled to the interconnecting part such that the electron blocking/tunneling layer of the photodetector is closer than the light sensitizing layer is to the interconnecting part. The OLED can be coupled to the interconnecting part such that the HTL of the OLED is closer than the ETL is to the interconnecting part. The photodetector can include an electrode under the light sensitizing layer, and that electrode can be an anode. The OLED can include an electrode on the ETL, and that electrode can be a cathode.

In an embodiment, coupling the photodetector with gain to the OLED can include coupling the photodetector with gain directly to the OLED. The photodetector with gain can be coupled to the OLED such that the ETL of the OLED is closer to the light sensitizing layer of the photodetector than it is to the electron blocking/tunneling layer of the photodetector. In a particular embodiment, the photodetector can include a hole blocking layer adjacent to the light sensitizing layer, and the photodetector with gain can be coupled to the OLED such that the ETL of the OLED is adjacent to and in contact with the hole blocking layer of the photodetector. The photodetector can include an electrode adjacent to and in contact with the electron blocking/tunneling layer, and the OLED can include an electrode adjacent to and in contact with the HTL. The electrode of the photodetector can be, for example, a cathode, and the electrode of the OLED can be, for example, an anode.

Embodiments of the subject invention also relate to methods of upconverting IR radiation to visible radiation using an IR-to-visible upconversion device. The IR-to-visible upconversion device can include a photodetector and an LED. The LED can be an OLED. The IR-to-visible upconversion device can be an IR-to-visible upconversion device with gain, and the photodetector can be a photodetector with gain. The OLED can include at least one electrode, a hole transporting layer (HTL), a light emitting layer (LEL), and an electron transporting layer (ETL).

At least one electrode of the OLED can be transparent to at least a portion of visible and/or at least a portion of IR light, though embodiments are not limited thereto. Each electrode of the OLED can include one or more of the following materials: ITO, IZO, ATO, AZO, silver, calcium, magnesium, gold, aluminum, carbon nanotubes, silver nanowire, LiF/Al/ITO, Ag/ITO, CsCO$_3$/ITO, and a Mg:Ag/Alq3 stack layer, though embodiments are not limited thereto. The HTL of the OLED can include one or more of the following materials: NPD, TAPC, TFB, TPD, and diamine derivative, though embodiments are not limited thereto. The LEL of the OLED can include one or more of the following materials: Ir(ppy)3, MEH-PPV, Alq3, and Flrpic, though embodiments are not limited thereto. The ETL of the OLED can include one or more of the following materials: BCP, Bphen, 3TPYMB, and Alq3, though embodiments are not limited thereto.

In a particular embodiment, the electrode of the OLED is a Mg:Ag/Alq3 stack layer. The Mg:Ag layer of the Mg:Ag/Alq3 stack layer can have a composition of, for example, Mg:Ag (10:1) and can have a thickness of, for example, less than 30 nm. The Alq3 layer of the Mg:Ag/Alq3 stack layer can have a thickness of, for example, from 0 nm to 200 nm.

The photodetector can be a photodetector with gain as described herein, though only one electrode need be present. That is, the photodetector can include at least one electrode, a light sensitizing layer, and an electron blocking/tunneling layer. The photodetector can also optionally include a substrate and/or a hole blocking layer.

The electrode can include one or more of the following materials: ITO, IZO, ATO, AZO, silver, calcium, magnesium, gold, aluminum, carbon nanotubes, silver nanowire, LiF/Al/ITO, Ag/ITO, and CsCO$_3$/ITO.

In certain embodiments, the photodetector can be an IR photodetector and the light sensitizing layer can be an IR sensitizing layer. The light sensitizing layer can include, for example, one or more of the following materials: PbS nanocrystals (quantum dots), PbSe nanocrystals (quantum dots), PCTDA, SnPc, SnPc:C60, AlPcCl, AlPeCl:C60, TiOPc, TiOPc:C60, PbSe, PbS, InAs, InGaAs, Si, Ge, and GaAs.

In an embodiment, the electron blocking/tunneling layer can be a TAPC/MoO$_3$ stack layer. The TAPC layer can have a thickness of, for example, 0 nm to 100 nm. The MoO$_3$ layer can have a thickness of, for example, 0 nm to 100 nm.

In an embodiment, the photodetector can include a hole blocking layer, and the hole blocking layer can include one or more of the following materials: ZnO, NTCDA, BCP, UGH2, BPhen, Alq3, mCP, 3TPYMB, and TiO$_2$.

In a further embodiment, the IR-to-visible upconversion device can also include an interconnecting part between the photodetector and the OLED. The interconnecting part can be positioned such that the electron blocking/tunneling layer of the photodetector is closer than the light sensitizing layer is to the interconnecting part, and the HTL of the OLED is closer than the ETL is to the interconnecting part. The photodetector can include an electrode under the light sensitizing layer, and that electrode can be an anode. The OLED can include an electrode on the ETL, and that electrode can be a cathode.

In an embodiment, the IR-to-visible upconversion device does not include an interconnecting part, and the photodetector is positioned directly adjacent to the OLED. The OLED can be positioned such that the ETL of the OLED is closer to the light sensitizing layer of the photodetector than it is to the electron blocking/tunneling layer of the photodetector. In a particular embodiment, the photodetector can include a hole blocking layer adjacent to the light sensitizing layer, and the ETL of the OLED can be positioned adjacent to and in contact with the hole blocking layer of the photodetector. The photodetector can include an electrode adjacent to and in contact with the electron blocking/tunneling layer, and the OLED can include an electrode adjacent to and in contact with the HTL. The electrode of the photodetector can be, for example, a cathode, and the electrode of the OLED can be, for example, an anode.

In many embodiments, the IR-to-visible upconversion device can be flipped or turned around and still function properly. The OLED can be transparent to at least a portion of light in the IR spectrum, though embodiments are not limited thereto. The photodetector can be transparent to at least a portion of light in the visible spectrum, though embodiments are not limited thereto.

The IR-to-visible upconversion device upconverts IR light to visible light. The IR-to-visible upconversion emits visible light from the OLED when the photodetector absorbs IR light. That is, the light sensitizing layer (e.g., an IR sensitizing layer) of the photodetector absorbs IR light, causing carriers to flow. The carriers flow to the OLED, either directly or via an interconnecting part, causing the LEL of the OLED to emit visible light. The IR-to-visible upconversion device can include a photodetector with gain and can advantageously exhibit gain.

Example 1

A photodetector was fabricated on a glass substrate. The photodetector included an ITO first electrode, a ZnO hole blocking layer on the first electrode, a PbS quantum dot light sensitizing layer on the hole blocking layer, a TAPC/MoO$_3$ stack electron blocking/tunneling layer on the light sensitizing layer, and a second electrode on the electron blocking/tunneling layer. The PbS quantum dot light sensitizing layer had the absorbance spectrum shown in FIG. 1A. The photodetector displayed the J-V characteristic curves (for dark and IR illumination at 1240 nm and 0.302 W/cm$_2$) shown in FIG. 3B. Additionally, the photodetector exhibited the gain and detectivity, as functions of applied voltage, shown in FIGS. 4A and 4B, respectively.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. An infrared (IR)-to-visible upconversion device, comprising:
    a photodetector with gain; and
    an organic light-emitting device (OLED) coupled to the photodetector with gain,
    wherein the photodetector with gain comprises:
        a first photodetector electrode;
        a light sensitizing layer on the first photodetector electrode;
        an electron blocking/tunneling layer on the light sensitizing layer; and
        a second photodetector electrode on the electron blocking/tunneling layer,
        wherein the electron blocking/tunneling layer is a TAPC/MoO$_3$ stack layer.

2. The IR-to-visible upconversion device according to claim 1, wherein the light sensitizing layer is sensitive to photons having a wavelength in a range of from 0.7 μm to 14 μm, inclusive.

3. The IR-to-visible upconversion device according to claim 2, wherein the light sensitizing layer is insensitive to photons having a wavelength of at least 0.4 µm and less than 0.7 µm.

4. The IR-to-visible upconversion device according to claim 1, wherein the light sensitizing layer comprises PbS quantum dots or PbSe quantum dots.

5. The IR-to-visible upconversion device according to claim 1, wherein the light sensitizing layer comprises PbS quantum dots.

6. The IR-to-visible upconversion device according to claim 1, wherein the light sensitizing layer comprises at least one material selected from the group consisting of PbS quantum dots, PbSe quantum dots, PCTDA, SnPc, SnPc:C60, AlPcCl, AlPcCl:C60, TiOPc, TiOPc:C60, PbSe, PbS, InAs, InGaAs, Si, Ge, and GaAs.

7. The IR-to-visible upconversion device according to claim 1, wherein the first photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and $CsCO_3$/ITO.

8. The IR-to-visible upconversion device according to claim 1, wherein the second photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and $CsCO_3$/ITO.

9. The IR-to-visible upconversion device according to claim 1, wherein the first photodetector electrode is an anode, and wherein the second photodetector electrode is a cathode.

10. The IR-to-visible upconversion device according to claim 9, wherein the first photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and $CsCO_3$/ITO; and wherein the second photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and $CsCO_3$/ITO.

11. The IR-to-visible upconversion device according to claim 1, wherein the TAPC layer is in direct contact with the light sensitizing layer, and wherein the $MoO_3$ layer is in direct contact with the second photodetector electrode.

12. The IR-to-visible upconversion device according to claim 1, wherein the TAPC layer has a thickness of no more than 100 nm, and wherein the $MoO_3$ layer has a thickness of no more than 100 nm.

13. The IR-to-visible upconversion device according to claim 1, further comprising a hole blocking layer on the first photodetector electrode and under the light sensitizing layer.

14. The IR-to-visible upconversion device according to claim 13, wherein the hole blocking layer comprises at least one material selected from the group consisting of ZnO, naphthalene tetracarboxylic anhydride (NTCDA), 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline)aluminum (Alq3), 3,5'-N,N'-dicarbazole-benzene (mCP), C60, tris[3-(3-pyridyl)-mesityl]borane (3TPYMB), and $TiO_2$.

15. The IR-to-visible upconversion device according to claim 1, wherein the OLED comprises an OLED electrode, a hole transporting layer (HTL), a light emitting layer (LEL), and an electron transporting layer (ETL).

16. The IR-to-visible upconversion device according to claim 15, wherein the OLED electrode comprises at least one material selected from the group consisting of ITO, IZO, ATO, AZO, silver, calcium, magnesium, gold, aluminum, carbon nanotubes, silver nanowire, LiF/Al/ITO, Ag/ITO, $CsCO_3$/ITO, and a Mg:Ag/Alq3 stack layer.

17. The IR-to-visible upconversion device according to claim 15, wherein the HTL comprises at least one material selected from the group consisting of NPD, TAPC, TFB, TPD, and diamine derivative.

18. The IR-to-visible upconversion device according to claim 15, wherein the LEL comprises at least one material selected from the group consisting of Iridium tris(2-phenylpyidine) (Ir(ppy)3), [2-methoxy-5-(2-ethylhexyloxy)-p-phenylenevinylene] (MEW PPV), Tris-(8-quinolinolato)aluminum) (Alq3), and bis[(4,6-di-fluorophenyl)-pyridinate-] picolinate (Flrpic).

19. The IR-to-visible upconversion device according to claim 15, wherein the ETL comprises at least one material selected from the group consisting of BCP, Bphen, 3TPYMB, and Alq3.

20. The IR-to-visible upconversion device according to claim 15, wherein the OLED electrode comprises a Mg:Ag/Alq3 stack layer, wherein the Mg:Ag layer of the Mg:Ag/Alq3 stack layer has a composition of Mg:Ag (10:1), wherein the Mg:Ag layer has a thickness of less than 30 nm, and wherein the Alq3 layer of the Mg:Ag/Alq3 stack layer has a thickness of no more than 200 nm.

21. The IR-to-visible upconversion device according to claim 15,
wherein the electron blocking/tunneling layer is a TAPC/$MoO_3$ stack layer,
wherein the TAPC layer is in direct contact with the light sensitizing layer,
wherein the $MoO_3$ layer is in direct contact with the second photodetector electrode, and
wherein the light sensitizing layer comprises PbS quantum dots.

22. The IR-to-visible upconversion device according to claim 21, further comprising a hole blocking layer on the first photodetector electrode and under the light sensitizing layer.

23. The IR-to-visible upconversion device according to claim 15, wherein the photodetector with gain is positioned directly adjacent to the OLED, and wherein the OLED is positioned such that the ETL of the OLED is closer to the light sensitizing layer of the photodetector with gain than it is to the electron blocking/tunneling layer of the photodetector with gain.

24. The IR-to-visible upconversion device according to claim 15, further comprising an interconnecting part between the photodetector with gain and the OLED, wherein the interconnecting part is positioned such that the electron blocking/tunneling layer of the photodetector with gain is closer than the light sensitizing layer is to the interconnecting part, and wherein the interconnecting part is positioned such that the HTL of the OLED is closer than the ETL is to the interconnecting part.

25. The IR-to-visible upconversion device according to claim 24, wherein the interconnecting part comprises a hole blocking layer (HBL) and an electron blocking layer (EBL), wherein the interconnecting part is positioned such that the HBL of the interconnecting part is adjacent to and in direct contact with the second photodetector electrode, and wherein the interconnecting part is positioned such that EBL of the interconnecting part is adjacent to and in direct contact with the HTL of the OLED.

26. The IR-to-visible upconversion device according to claim 25, wherein a lowest unoccupied molecular orbital (LUMO) of the HBL of the interconnecting part is within 0.5 electron volts (eV) of a highest occupied molecular orbital (HOMO) of the EBL of the interconnecting part.

27. The IR-to-visible upconversion device according to claim 1, further comprising an interconnecting part between the photodetector with gain and the OLED, wherein the interconnecting part is positioned such that the electron blocking/tunneling layer of the photodetector with gain is closer than the light sensitizing layer is to the interconnecting part.

28. The IR-to-visible upconversion device according to claim 27, wherein the interconnecting part comprises a hole blocking layer (HBL) and an electron blocking layer (EBL),
wherein the interconnecting part is positioned such that the HBL of the interconnecting part is adjacent to and in direct contact with the second photodetector electrode, and
wherein the interconnecting part is positioned such that EBL of the interconnecting part is adjacent to and in direct contact with the HTL of the OLED.

29. The IR-to-visible upconversion device according to claim 28, wherein a lowest unoccupied molecular orbital (LUMO) of the HBL of the interconnecting part is within 0.5 electron volts (eV) of a highest occupied molecular orbital (HOMO) of the EBL of the interconnecting part.

30. A method of forming an IR-to-visible upconversion device, comprising:
forming a photodetector with gain;
forming an OLED; and
coupling the OLED to the photodetector with gain, wherein forming the photodetector with gain comprises:
forming a first electrode; forming a light sensitizing layer on the first electrode;
forming an electron blocking/tunneling layer on the light sensitizing layer, wherein forming the electron blocking/tunneling layer comprises forming a TAPC/MoO$_3$ stack layer; and
forming a second electrode on the electron blocking/tunneling layer.

31. The method according to claim 30, wherein the light sensitizing layer is sensitive to photons having a wavelength in a range of from 0.7 µm to 14 µm, inclusive.

32. The method according to claim 31, wherein the light sensitizing layer is insensitive to photons having a wavelength of at least 0.4 µm and less than 0.7 µm.

33. The method according to claim 30, wherein the light sensitizing layer comprises PbS quantum dots or PbSe quantum dots.

34. The method according to claim 30, wherein the light sensitizing layer comprises PbS quantum dots.

35. The method according to claim 30, wherein the light sensitizing layer comprises at least one material selected from the group consisting of PbS quantum dots, PbSe quantum dots, PCTDA, SnPc, SnPc:C60, AlPcCl, AlPcCl: C60, TiOPc, TiOPc:C60, PbSe, PbS, InAs, InGaAs, Si, Ge, and GaAs.

36. The method according to claim 30, wherein the first photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and CsCO$_3$/ITO.

37. The method according to claim 30, wherein the second photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and CsCO$_3$/ITO.

38. The method according to claim 30, wherein the first photodetector electrode is an anode, and wherein the second photodetector electrode is a cathode.

39. The method according to claim 38, wherein the first photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and CsCO$_3$/ITO; and wherein the second photodetector electrode comprises at least one material selected from the group consisting of indium tin oxide (ITO), indium zinc oxide (IZO), aluminum tin oxide (ATO), aluminum zinc oxide (AZO), silver, calcium, magnesium, gold, aluminum, carbon nanotubes, silver nanowire, LiF/Al/ITO, Ag/ITO, and CsCO$_3$/ITO.

40. The method according to claim 30, wherein the TAPC layer is formed in direct contact with the light sensitizing layer, and wherein the second photodetector electrode is formed in direct contact with the MoO3 layer.

41. The method according to claim 30, wherein the TAPC layer has a thickness of no more than 100 nm, and wherein the MoO3 layer has a thickness of no more than 100 nm.

42. The method according to claim 30, further comprising forming a hole blocking layer on the first photodetector electrode, wherein the light sensitizing layer is formed on the hole blocking layer.

43. The method according to claim 42, wherein the hole blocking layer comprises at least one material selected from the group consisting of ZnO, naphthalene tetracarboxylic anhydride (NTCDA), 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline)aluminum (Alq3), 3,5'-N,N'-dicarbazole-benzene (mCP), C60, tris[3-(3-Pyridyl)-mesityl]borane (3TPYMB), and TiO$_2$.

44. The method according to claim 30, wherein forming the OLED comprises:
forming an OLED electrode;
forming a hole transporting layer (HTL);
forming a light emitting layer (LEL); and
forming an electron transporting layer (ETL).

45. The method according to claim 44, wherein the OLED electrode comprises at least one material selected from the group consisting of ITO, IZO, ATO, AZO, silver, calcium, magnesium, gold, aluminum, carbon nanotubes, silver nanowire, LiF/Al/ITO, Ag/ITO, CsCO$_3$/ITO, and a Mg:Ag/Alq3 stack layer.

46. The method according to claim 44, wherein the HTL comprises at least one material selected from the group consisting of NPD, TAPC, TFB, TPD, and diamine derivative.

47. The method according to claim 44, wherein the LEL comprises at least one material selected from the group consisting of Iridium tris(2-phenylpyidine) (Ir(ppy)3), [2-methoxy-5-(2-ethylhexyloxy)-p-phenylenevinylene] (MEII-PPV), Tris-(8-quinolinolato)aluminum) (Alq3), and bis[(4,6-di-fluorophenyl)-pyridinate-]picolinate (Flrpic).

48. The method according to claim 44, wherein the ETL comprises at least one material selected from the group consisting of BCP, Bphen, 3TPYMB, and Alq3.

49. The method according to claim 44, wherein forming the OLED electrode comprises forming a Mg:Ag/Alq3 stack layer, wherein the Mg:Ag layer of the Mg:Ag/Alq3 stack layer has a composition of Mg:Ag (10:1), wherein the Mg:Ag layer has a thickness of less than 30 nm, and wherein the Alq3 layer of the Mg:Ag/Alq3 stack layer has a thickness of no more than 200 nm.

50. The method according to claim 44,
wherein forming the electron blocking/tunneling layer comprises forming a TAPC/$MoO_3$ stack layer,
wherein the TAPC layer is formed in direct contact with the light sensitizing layer,
wherein the second photodetector electrode is formed in direct contact with the $MoO_3$ layer, and wherein the light sensitizing layer comprises PbS quantum dots.

51. The method according to claim 50, further comprising forming a hole blocking layer on the first photodetector electrode, wherein the light sensitizing layer is formed on the hole blocking layer.

52. The method according to claim 44, wherein the photodetector with gain is positioned directly adjacent to the OLED, and wherein the OLED is positioned such that the ETL of the OLED is closer to the light sensitizing layer of the photodetector with gain than it is to the electron blocking/tunneling layer of the photodetector with gain.

53. The method according to claim 40, wherein coupling the OLED to the photodetector with gain comprises:
forming an interconnecting part;
coupling the OLED to the interconnecting part; and
coupling the photodetector with gain to the interconnecting part,
wherein the interconnecting part is positioned such that the electron blocking/tunneling layer of the photodetector with gain is closer than the light sensitizing layer is to the interconnecting part, and
wherein the interconnecting part is positioned such that the HTL of the OLED is closer than the ETL is to the interconnecting part.

54. The method according to claim 53, wherein forming the interconnecting part comprises:
forming a hole blocking layer (HBL); and
forming electron blocking layer (EBL),
wherein the interconnecting part is positioned such that the HBL of the interconnecting part is adjacent to and in direct contact with the second photodetector electrode, and
wherein the interconnecting part is positioned such that EBL of the interconnecting part is adjacent to and in direct contact with the HTL of the OLED.

55. The method according to claim 54, wherein a lowest unoccupied molecular orbital (LUMO) of the HBL of the interconnecting part is within 0.5 electron volts (eV) of a highest occupied molecular orbital (HOMO) of the EBL of the interconnecting part.

56. The method according to claim 55, wherein coupling the OLED to the photodetector with gain comprises:
forming an interconnecting part;
coupling the OLED to the interconnecting part; and
coupling the photodetector with gain to the interconnecting part,
wherein the interconnecting part is positioned such that the electron blocking/tunneling layer of the photodetector with gain is closer than the light sensitizing layer is to the interconnecting part.

57. The method according to claim 56, wherein forming the interconnecting part comprises:
forming a hole blocking layer (HBL); and
forming electron blocking layer (EBL),
wherein the interconnecting part is positioned such that the HBL of the interconnecting part is adjacent to and in direct contact with the second photodetector electrode, and
wherein the interconnecting part is positioned such that EBL of the interconnecting part is adjacent to and in direct contact with the HTL of the OLED.

58. The method according to claim 57, wherein a lowest unoccupied molecular orbital (LUMO) of the HBL of the interconnecting part is within 0.5 electron volts (eV) of a highest occupied molecular orbital (HOMO) of the EBL of the interconnecting part.

59. A method of detecting IR radiation using a photodetector with gain, comprising:
providing a photodetector with gain, such that IR radiation is incident upon the photodetector with gain,
wherein the photodetector with gain comprises:
a first electrode;
an IR light sensitizing layer on the first electrode;
an electron blocking/tunneling layer on the light sensitizing layer; and
a second electrode on the electron blocking/tunneling layer,
wherein the electron blocking/tunneling layer is a TAPC/$MoO_3$ stack layer.

60. A method of upconverting IR radiation to visible radiation using an IR-to-visible upconversion device, comprising:
providing an IR-to-visible upconversion device such that IR radiation is incident upon the IR-to-visible upconversion device,
wherein the IR-to-visible upconversion device comprises:
a photodetector with gain; and
an organic light-emitting device (OLED) coupled to the photodetector with gain,
wherein the photodetector with gain comprises:
a first photodetector electrode;
an IR light sensitizing layer on the first photodetector electrode;
an electron blocking/tunneling layer on the light sensitizing layer; and
a second photodetector electrode on the electron blocking/tunneling layer,
wherein the electron blocking/tunneling layer is a TAPC/$MoO_3$ stack layer.

61. The IR-to-visible upconversion device according to claim 1, wherein the electron blocking/tunneling layer comprises hole-trapping sites.

62. The method according to claim 30, wherein the electron blocking/tunneling layer comprises hole-trapping sites.

63. The method according to claim 59, wherein the electron blocking/tunneling layer comprises hole-trapping sites.

64. The method according to claim 60, wherein the electron blocking/tunneling layer comprises hole-trapping sites.

\* \* \* \* \*